United States Patent
Sohn et al.

(10) Patent No.: US 8,391,088 B2
(45) Date of Patent: Mar. 5, 2013

(54) PSEUDO-OPEN DRAIN TYPE OUTPUT DRIVER HAVING DE-EMPHASIS FUNCTION, SEMICONDUCTOR MEMORY DEVICE, AND CONTROL METHOD THEREOF

(75) Inventors: Youngsoo Sohn, Seoul (KR); Taeyoung Oh, Seoul (KR); Seungjun Bae, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/289,240

(22) Filed: Nov. 4, 2011

(65) Prior Publication Data

US 2012/0113732 A1 May 10, 2012

(30) Foreign Application Priority Data

Nov. 9, 2010 (KR) .................. 10-2010-0111144

(51) Int. Cl.
*G11C 7/00* (2006.01)

(52) U.S. Cl. .................. 365/191; 365/193; 365/233.1; 365/194

(58) Field of Classification Search .................. 365/191, 365/194, 189.011, 233.1, 193, 230.06, 189.05
See application file for complete search history.

(56) References Cited

U.S. PATENT DOCUMENTS

| 7,321,240 | B2 | 1/2008 | Schaefer |
| 8,036,050 | B2 * | 10/2011 | Shin et al. .................. 365/191 |

FOREIGN PATENT DOCUMENTS

| KR | 10-0212597 B1 | 5/1999 |
| KR | 10-2007-0077308 A | 7/2007 |
| KR | 10-0892337 B1 | 4/2009 |

* cited by examiner

*Primary Examiner* — David Lam
(74) *Attorney, Agent, or Firm* — Volentine & Whitt, PLLC

(57) ABSTRACT

A semiconductor memory device includes a memory cell array, an output driver having a pseudo-open drain (POD) structure and providing read data from the memory cell array in a de-emphasis mode, and control logic controlling the output driver in response to a read command to activate the de-emphasis mode. The control logic activates the de-emphasis mode only during an output period during which the read data is output by the output driver.

20 Claims, 22 Drawing Sheets

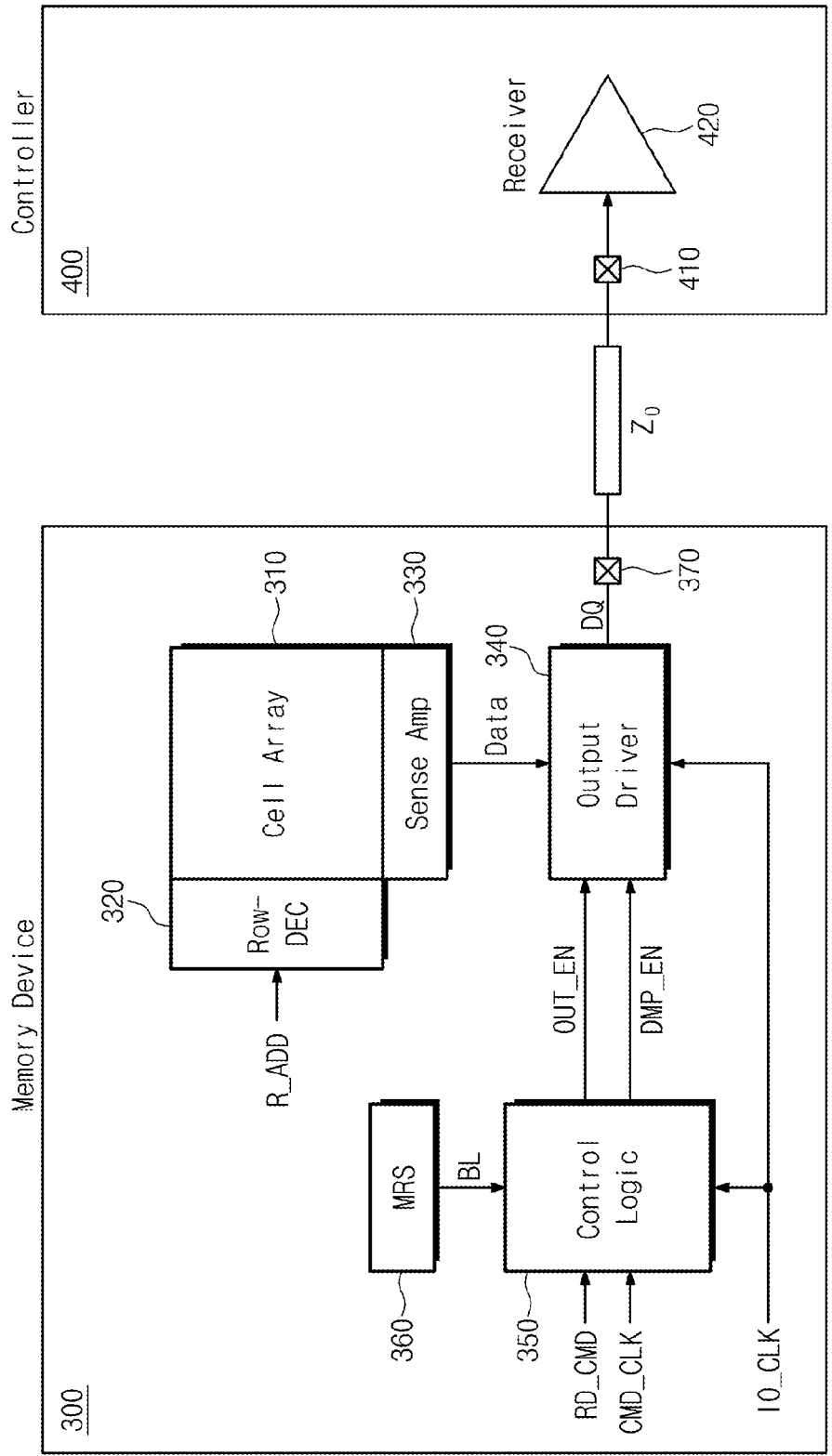

PSEUDO-OPEN DRAIN TYPE OUTPUT DRIVER HAVING DE-EMPHASIS FUNCTION, SEMICONDUCTOR MEMORY DEVICE, AND CONTROL METHOD THEREOF

CROSS-REFERENCE TO RELATED APPLICATIONS

This application claims the benefits under 35 U.S.C. §119 of Korean Patent Application No. 10-2010-0111144 filed Nov. 9, 2010, the subject matter of which is hereby incorporated by reference.

BACKGROUND OF THE INVENTION

Embodiments of the inventive concept relate to pseudo-open drain type output drivers having a de-emphasis function, semiconductor memory device including same, and related control methods.

A semiconductor memory device may be a storage device which stores data and reads the stored data as occasion arises. Semiconductor memory devices may be generally classified as Random Access Memory (RAM) and Read Only Memory (ROM).

RAM is typically a volatile memory device that loses stored data in the absence of applied power. ROM is typically a nonvolatile memory device that retains stored data even when applied power is interrupted. RAM includes dynamic RAM (DRAM), static RAM (SRAM), and the like. ROM includes programmable ROM (PROM), erasable PROM (EPROM), electrically EPROM (EEPROM) including flash memory, and the like.

Semiconductor memory devices output data to external circuits using an output driver. Output drivers are usually connected to these external circuits via an output pad. Output pads are generally well understood elements that may be implemented using a variety of designs. Certain contemporary semiconductor devices incorporate a type of output driver commonly referred to as a pseudo-open drain (POD) type output driver. This type of output driver contribute to the definitions of output impedance, output signaling, etc.

SUMMARY OF THE INVENTION

In one aspect, an embodiment of the inventive concept is directed to semiconductor memory including a memory cell array, an output driver having a pseudo-open drain (POD) structure and configured to output read data retrieved from the memory cell array in a de-emphasis mode, and a control logic configured to control the output driver and activate the de-emphasis mode in response to a received read command, wherein the control logic activates the de-emphasis mode only during an output period in which the read data is output by the output driver in the de-emphasis mode.

In another aspect, an embodiment of the inventive concept is directed to a control method for an output driver in a semiconductor memory device, the output driver being operated according to a pseudo-open drain (POD) signaling scheme, the method comprising; upon receiving a read command, activating a de-emphasis mode for the output driver, retrieving read data from a cell array and outputting the read data in the de-emphasis mode, and inactivating the de-emphasis mode when the read data is output is complete, such that the de-emphasis mode is only activated during an output period during which the read data is output by the output driver.

In another aspect, an embodiment of the inventive concept is directed to a control method for an output driver in a semiconductor memory in a system including the semiconductor memory and a memory controller, wherein the output driver is operated according to a pseudo-open drain (POD) signaling scheme and the method comprises; communicating a read command, an output enable signal, and a de-emphasis enable signal from the memory controller to the semiconductor memory, retrieving read data identified by the read command from a cell array in the semiconductor memory, in response to the output enable signal and the de-emphasis enable signal, either outputting the read data via a normal driver in the output driver or outputting the read data via a de-emphasis driver in the output driver, such that the de-emphasis driver is only activated during an output period in which the read data is output by via the de-emphasis driver.

BRIEF DESCRIPTION OF THE DRAWINGS

The above and other objects and features will become apparent upon consideration of the following description with reference to the accompanying drawings. Throughout the written description and drawings, like reference numbers and labels are sued to denote like or similar elements, unless otherwise specified.

FIG. 4 is a block diagram illustrating a memory device according to an embodiment of the inventive concept.

DETAILED DESCRIPTION

The inventive concept will now be described in some additional detail with reference to the accompanying drawings in which certain embodiments of the inventive concept are shown. This inventive concept may, however, be embodied in many different forms and should not be construed as being limited to only the illustrated embodiments. Rather, these embodiments are provided so that this disclosure will be thorough and complete, and will fully convey the scope of the inventive concept to those skilled in the art.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 1A:
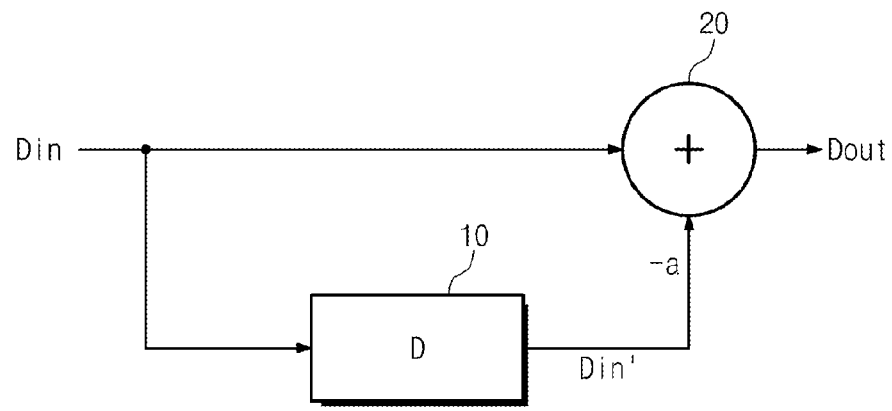
FIGS. 1A and 1B are diagrams describing a de-emphasis technique.
Figure 1B:
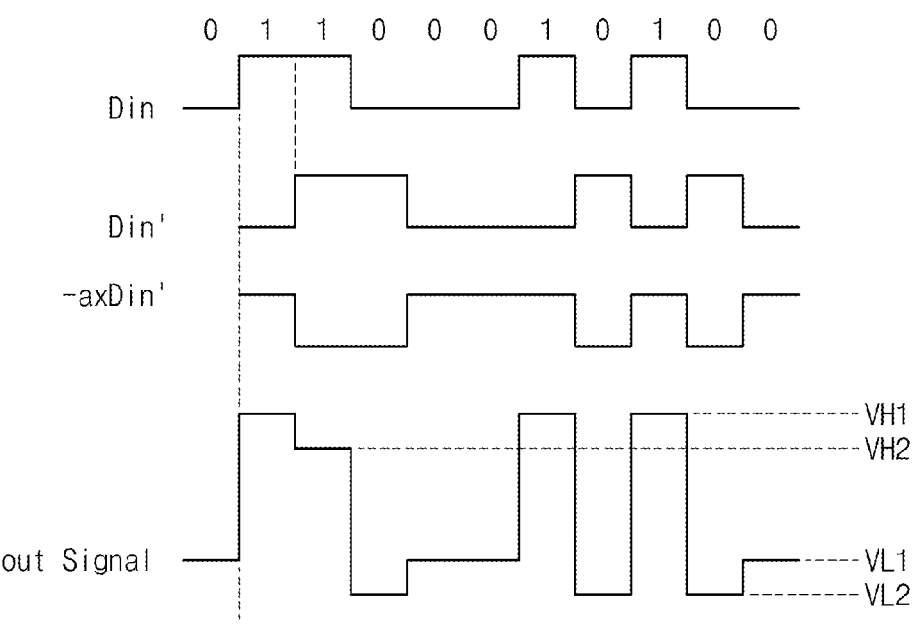

FIGS. 1A and 1B are diagrams describing a de-emphasis technique.

FIG. 1A shows how de-emphasis of an input signal Din is accomplished. The received input signal Din is transferred via two parallel signal paths. One may be a path where the input signal Din is directly transferred to an adder 20, and the other may be a path where the input signal Din passes through a delay 10 and is inverted. The delay 10 may control a delay magnitude of the input signal Din. The adder 20 may be configured to add an original/source data and a delayed and inverted signal. However, the adder 20 can be formed of a wired-OR manner. The resulting signal provided by the adder 20 is an output signal Dout.

FIG. 1B further describes the operation of a de-emphasis circuit of FIG. 1A. Referring to FIG. 1B, an input signal Din is assumed to include a bit string of "01100010100". The delayed input signal Din' provide by the delay 10 is also shown in FIG. 1B. The delayed input signal Din' may be inverted. Upon inverting, a level of the inverted signal (now, $-a \times Din'$) may be controlled by variation of constant "a".

The output signal Dout may have a waveform obtained by adding the input signal Din and the delayed input signal $-a \times Din'$. Referring to the output signal Dout, although the same bit is output successively, different voltage levels may be output. For example, in the event that bits of "11" are output, a voltage VH1 may be output as a first bit "1", and a voltage VH2 lower than the voltage VH1 may be output as a second bit "1". This relationship may be applied to successive bits of "00". A voltage VL2 may be output as a first bit "0", and a voltage VL1 higher than the voltage VL2 may be output as a second bit "0".

Problems caused due to the channel bandwidth limitation may be overcome using an approach like the one described above that provides the output signal Dout. The rectangular wave indicating the input data Din may include a high frequency noise component. If a de-emphasis technique that stepwise increases or decreases a level is applied to the rectangular wave, the high frequency noise component may be considerably suppressed. This enables the noted limitation on channel bandwidth to be overcome.

As illustrated in FIG. 1B, if data is transferred using a 4-level signal or a multi-level (more than 4) signal according to the de-emphasis technique, the inter-symbol interface (ISI) generated due to the high frequency noise component may be reduced. With the de-emphasis technique, signals may be transferred using various voltage levels when they are actually sent. However, a signal may maintain an intermediate level during state(s) in which no signal is actually being transferred (hereafter, collectively and respectively referred to as "an idle state"). As a result, current is consumed during the idle state.

Figure 2:
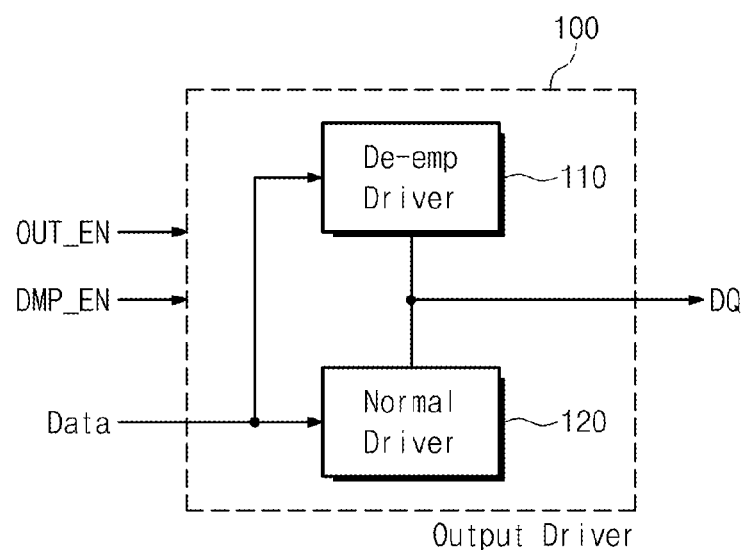
FIG. 2 is a block diagram illustrating an output driver having a de-emphasis function according to an embodiment of the inventive concept.

FIG. 2 is a block diagram illustrating an output driver having a de-emphasis function according to an embodiment of the inventive concept. Referring to FIG. 2, an output driver 100 comprises a de-emphasis driver 110 and a normal driver 120. The output driver 100 provides data at an output pad (e.g., a DQ pad) in response to an output enable signal OUT_EN and a de-emphasis enable signal DMP_EN. The output enable signal OUT_EN may be a control signal used to enable the output of data, and the de-emphasis enable signal DMP_EN may be a signal used to enable a de-emphasis mode of operation for the output driver 100.

If the output enable signal OUT_EN and the de-emphasis enable signal DMP_EN are both activated (e.g., the control signals are presented at a defined active level), the de-emphasis driver 110 will process data in a de-emphasis mode, as described in FIG. 1B. The de-emphasis driver 110 may terminate the de-emphasis mode when either one of the output enable signal OUT_EN and the de-emphasis enable signal DMP_EN is inactivated (e.g., the control signals are presented at a defined inactive level).

The normal driver 120 outputs data when the output enable signal OUT_EN is activated and the de-emphasis enable signal DMP_EN is inactivated. The normal driver 120 may output data in a binary mode, for example.

As illustrated in FIG. 2, the output driver 100 may enter the de-emphasis mode of operation in response to the activation of the de-emphasis enable signal DMP_EN. The de-emphasis enable signal DMP_EN may be activated during periods of time during which data should be output. Hence, power consumption generated due to the DC component described in relation to FIG. 1B may be minimized by determining periods of time when output data should be presented at a given output (e.g., DQ pad), and then generating the de-emphasis enable signal DMP_EN in accordance with this determination.

Figure 3:
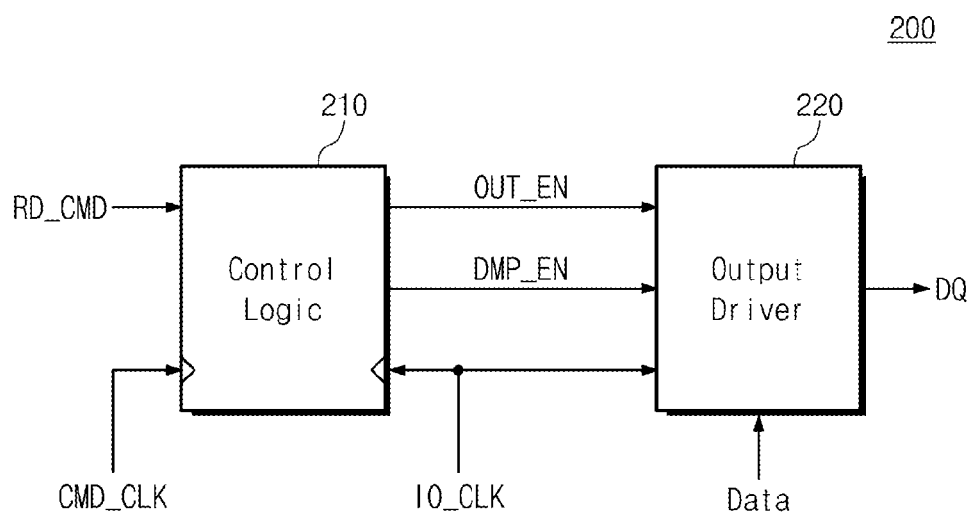
FIG. 3 is a block diagram illustrating a semiconductor device including the output driver of FIG. 2.

FIG. 3 is a block diagram illustrating a semiconductor device incorporating the output driver of FIG. 2. Referring to FIG. 3, a semiconductor device 200 generally comprises control logic 210 and an output driver 220.

In the illustrated example, the control logic 210 is assumed to provide the output driver 220 with an output enable signal OUT_EN and a de-emphasis enable signal DMP_EN. The control logic 210 may generate the output enable signal OUT_EN and the de-emphasis enable signal DMP_EN in response to a read command RD_CMD received from an external source (e.g., a connected host or memory controller). The read command may be synchronously provided to the control logic 210 with a command clock CMD_CLK. IN response, the control logic 210 may provide the output driver 220 with the output enable signal OUT_EN and the de-emphasis enable signal DMP_EN synchronously with an input/output clock IO_CLK generated by the control logic 210.

Thus, the control logic 210 may activate the de-emphasis enable signal DMP_EN during periods of time when output data should be output in response to the read command RD_CMD. Accordingly, the de-emphasis enable signal DMP_EN will be inactivated during other periods of time when output data is not actually output.

Further, the output driver 220 may output data in response to the output enable signal OUT_EN, and data may be output synchronously with the input/output clock IO_CLK. In particular, the output driver 220 may output data in a de-emphasis mode of operation in response to the de-emphasis enable signal DMP_EN.

As understood from the foregoing, the semiconductor device 200 may process data using a de-emphasis mode only during "output periods" (i.e., periods of time wherein data should be output). Accordingly, it is possible to markedly reduce power consumption due to a DC current otherwise generated during the de-emphasis mode.

FIG. 4 is a block diagram illustrating a memory device according to an embodiment of the inventive concept. Referring to FIG. 4, a memory device 300 may be configured to send retrieved read data to a controller 400. The memory device 300 of FIG. 4 may be one of a volatile memory such as DRAM or SRAM, or a nonvolatile memory device such as PRAM, MRAM, RRAM, or the like. The memory device 300 shown in FIG. 4 comprises in relevant portion a memory cell array 310, a row decoder 320, a sense amplifier 330, an output driver 340, control logic 350, and a mode register set 360.

The cell array 310 includes a great plurality of memory cells respectively configured to store data. Although not shown in FIG. 4, the memory cells may be arranged in a matrix of rows (or, word lines) and columns (or, bit lines).

The row decoder 320 may be used to select rows of the memory cells 310 according to a row address R_ADD provided by an address and command buffer (not shown). The sense amplifier 330 may be used to read data from the cell array 310 during a read operation.

The output driver 340 may be used to output data provided by the sense amplifier 330 to an external device via a pad 370 in response to an output enable signal OUT_EN. The data may be output synchronously with an input/output clock IO_CLK. In particular, the output driver 340 may output data in a de-emphasis manner in response to a de-emphasis enable signal DMP_EN. The output driver 340 may be configured like the output driver 100 or 220 illustrated in FIG. 2 or 3.

According to certain embodiment of the inventive concept, an output driver may use pseudo-open drain (POD) type signaling. An output driver using POD type signaling may be an interface adapted for use in accordance with the Graphics Double Data Rate 3 (GDDR3), the GDDR4, the GDDR5, and/or the DDR4 standards. Unlike a typical push-pull driver, the output driver using POD type signaling may be a voltage-based interface circuit rather than a current-based interface circuit.

The control logic 350 may be used to provide an output enable signal OUT_EN and a de-emphasis enable signal DMP_EN to the output driver 340. The control logic 350 may generate the output enable signal OUT_EN and the de-emphasis enable signal DMP_EN in response to an externally provided read command RD_CMD. The control logic 350 may activate the de-emphasis enable signal DMP_EN during output periods indicated by the read command RD_CMD, as well as other (or related) control signals, commands and/or instructions (e.g., a burst length BL, CAS latency, etc.). The de-emphasis enable signal DMP_EN will be inactivated during "non-output periods" (i.e., periods of time during which data is not being output).

Herein, the read command RD_CMD may be provided to the control logic 350 synchronously with a command clock CMD_CLK. The control logic 350 may provide the output enable signal OUT_EN and the de-emphasis enable signal DMP_EN to the output driver 340 synchronously with the input/output clock IO_CLK. Of note, the input/output clock IO_CLK of FIG. 4 is not necessarily generated by the control logic 350, but may be separately generated by a clock generator (not shown).

The mode register set 360 may be used to provide the control logic 350 with mode control (or defining) signals provided by a set feature. For example, the mode register set 360 may provide various parameters such as a burst mode BM, a burst length BL, a CAS latency CL, and the like.

Data output in a de-emphasis manner by the output driver 340 may be sent to the controller 400 via a transfer line. A receiver 420 may convert a transfer signal sent to the controller 400 into 2-level binary data. Equalization and process operations for a transfer signal typically performed by the receiver 420 are deemed to be well understood by those skilled in the art and will not be described in detail here.

As may be understood from the foregoing, although data is sent in a de-emphasis mode, the de-emphasis mode may be activated only during output periods. Accordingly, it is possible to prevent undue current consumption by the memory device 300 that will otherwise be caused due to formation of the DC circuit upon activation of the de-emphasis mode.

Figure 5A:
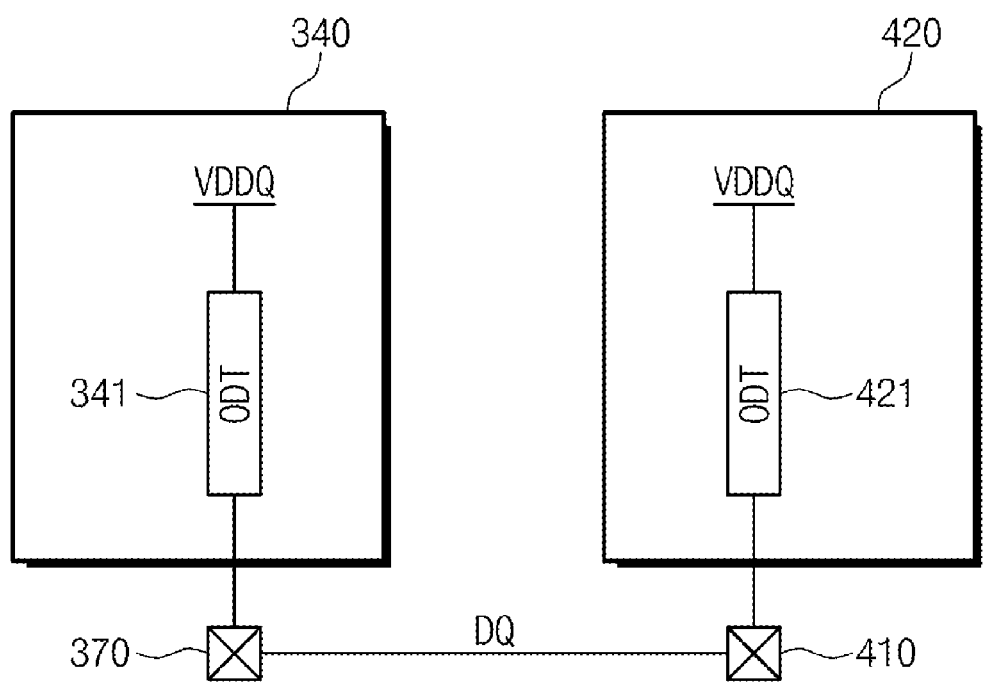
FIGS. 5A and 5B are diagrams describing an output driver and a receiver operating in response to activation/deactivation of a de-emphasis function.
Figure 5B:
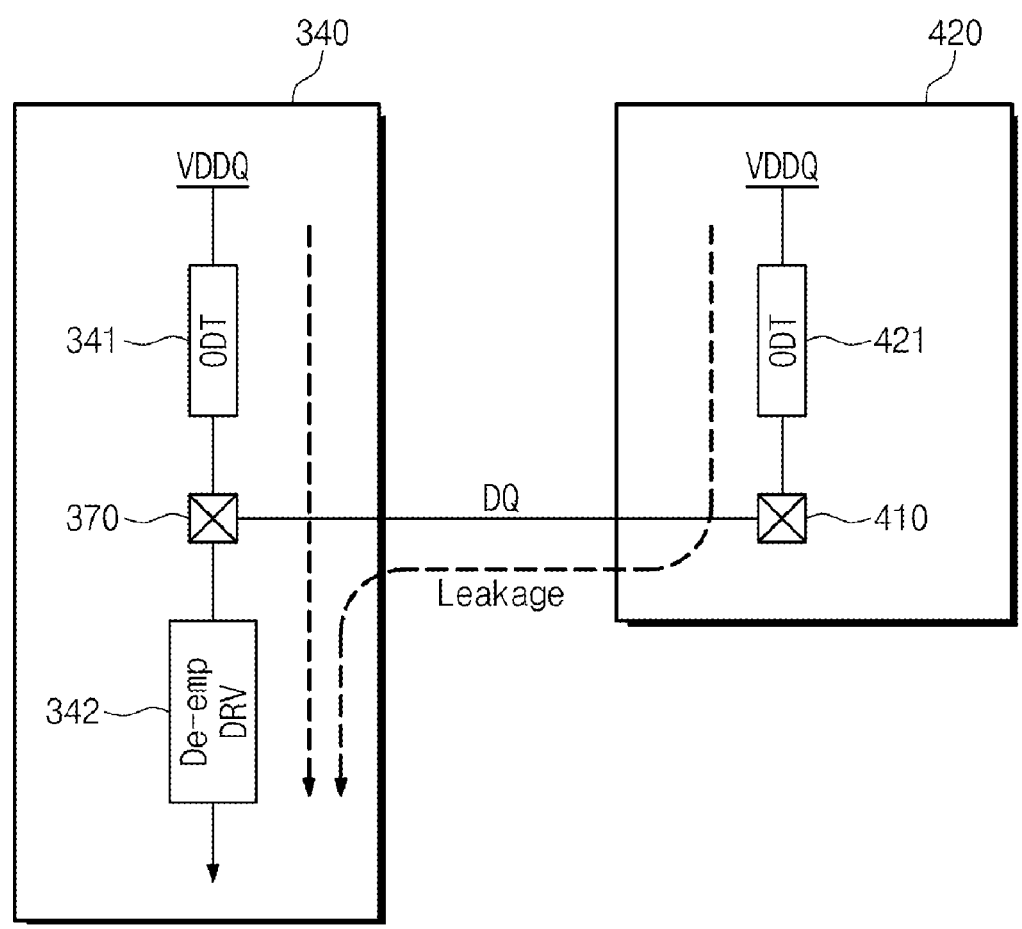

FIGS. 5A and 5B are diagrams further describing an output driver and a receiver during activation and inactivation of a de-emphasis function.

FIG. 5A shows an output driver 340 and a receiver 420 when a de-emphasis mode is inactivated. The output driver 340 and the receiver 420 may include on-die termination circuits 341 and 421 for impedance matching, respectively. If the de-emphasis mode is inactivated, the on-die termination circuits 341 and 421 of the output driver 340 and the receiver 420 may be activated. But, current consumption due to a transfer line or a power supply voltage VDDQ may be minimally generated. That is, no DC leakage path will exist when the de-emphasis mode is inactivated.

FIG. 5B shows the output driver 340 and the receiver 420 when a de-emphasis mode is activated. The output driver 340 and the receiver 420 may include the on-die termination circuits 341 and 421 for impedance matching, respectively. The output driver 340 may include a de-emphasis driver 342. If the de-emphasis driver 342 is activated, a DC leakage path may be formed regardless of a data transfer. The output driver 340 with a POD type may continue to send an intermediate-level signal during an idle state where a level of a signal is maintained constantly without signal transition. For this reason, the output driver 340 may consume a power even in the idle state.

The output driver 340 according to an embodiment of the inventive concept may be configured to inactivate the de-emphasis driver 342 during non-output periods. Accordingly, it is possible to minimize leakage current generated at a data input/output stage of a memory device 300, and reduce overall power consumption.

Figure 6:
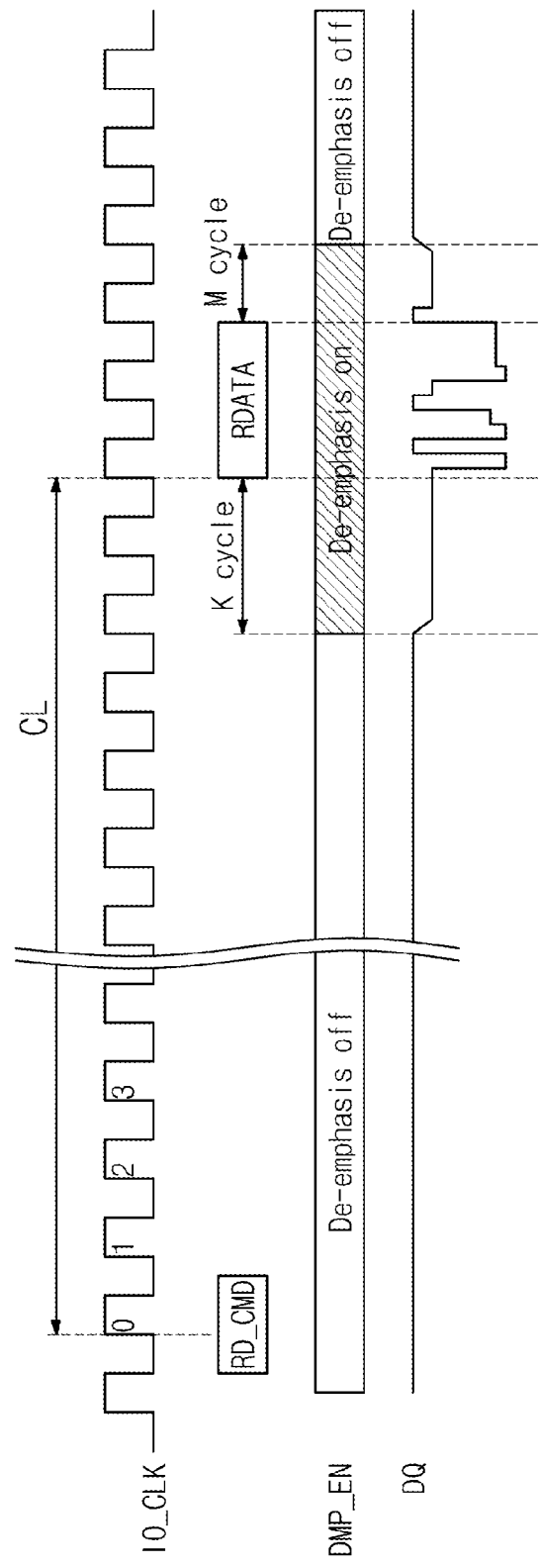
FIG. 6 is a timing diagram describing one possible operation for the output driver of FIG. 4.

FIG. 6 is a timing diagram describing one possible approach to the operation of the output driver of FIG. 4. In FIG. 6, a read command RD_CMD, read data RDATA, a de-emphasis enable signal DMP_EN, and a DQ signal according to a clock signal IO_CLK are indicated during a read operation being performed by the memory device 300 of FIG. 4.

Control logic 350 inactivates the de-emphasis enable signal DMP_EN during non-output periods. If the read command RD_CMD is input, the control logic 350 may activate the de-emphasis enable signal DMP_EN before a CAS latency CL. The control logic 350 may maintain an active state of the de-emphasis enable signal DMP_EN such that a de-emphasis mode is activated while the read data RDATA is output. After an output of the read data RDATA is ended, the control logic 350 may inactivate the de-emphasis enable signal DMP_EN.

The active period for the de-emphasis mode of the output driver 340 may include an output time period for the read data RDATA. To provide sufficient margin, the active period for the de-emphasis mode may further include K clock cycles before the read data RDATA begins output, and M clock cycles after the output of the read data RDATA is ended. Herein, "K" and "M" may be any positive integer, and will be defined according to application, operating mode, and/or particular semiconductor device. During a burst mode, the control logic 350 may determine an end point for the read data RDATA according to the burst length BL in order to control the de-emphasis mode.

With a de-emphasis control method illustrated in FIG. 6, since a de-emphasis mode is activated only during appropriately defined output periods (i.e., periods of time during which read data is output including front end and back end margins, as applicable), undue current consumption is reduced.

Figure 7:
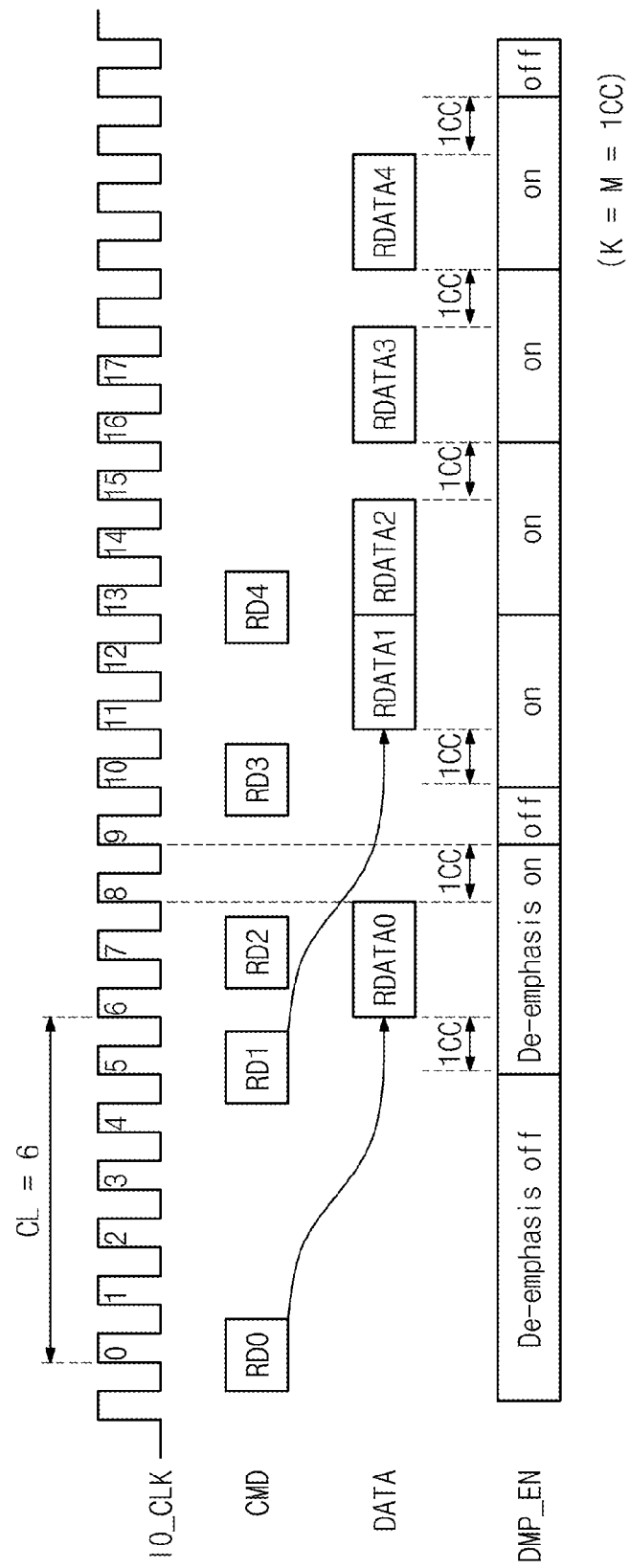
FIG. 7 is a timing diagram describing one possible de-emphasis control method that might be used when a read gap is narrow.

FIG. 7 is a timing diagram describing a de-emphasis control method that may be used when a read gap is narrow. A read gap may be defined as a number of cycle cycles between individual read data outputs. The read gap may include 1-clock cycle (1CC), 2-clock cycle (2CC), etc. Gapless reads may also exist. In FIG. 7, it is assumed that the CAS latency CL is 6, and that a back end margin "M" and a front end margin "K" are both 1. Under these assumptions, a read gap between first read data RDATA0 and second read data RDATA1 may be 3 clock cycles. A read gap between the second read data RDATA1 and third read data RDATA2 may be zero clock cycles.

Referring to FIG. 7, a de-emphasis mode may be activated during clock cycles corresponding to the first read data RDATA0 and the one-cycle front end and back end margins around the first read data RDATA0. The de-emphasis mode is inactivated once the output period associated with the first read data RDATA0 is ended. However, this is not the case when the second read data RDATA1 is output followed immediately (gaplessly) by the output of the third read data RDATA2, the fourth read data RDATA 3, and the fifth read data RDATA 4. Here, the de-emphasis mode is maintained as activated since read gaps between successive output periods are respectively too small to allow inactivation. Hence, the de-emphasis mode is maintained as activated throughout the output periods associated with the second through fifth read data RDATA1 to RDATA4 operations. Finally, the de-emphasis mode is inactivated following the output period associated with the fifth read data RDATA4. Thus, if a read gap between successive read data operations is less than or equal the sum of a defined front end margin and a defined back end margin, the de-emphasis mode will be continuously maintained as activated.

The foregoing example has been used to described a case wherein the de-emphasis mode is turned ON/OFF in accordance with a defined data output period. However, the scope of the inventive concept is not limited to only this approach. For example, if one read command RD_CMD is received following a preceding read command RD_CMD by less than or equal to a defined margin, the control logic 350 may be used to maintain activation of the de-emphasis mode throughout the successive read operations. Alternately or additionally, a minimum interval between receipt of a new read command and output of read data from a preceding read command may be defined and used to control activation/inactivation of the de-emphasis mode by the control logic 350.

Figure 8:
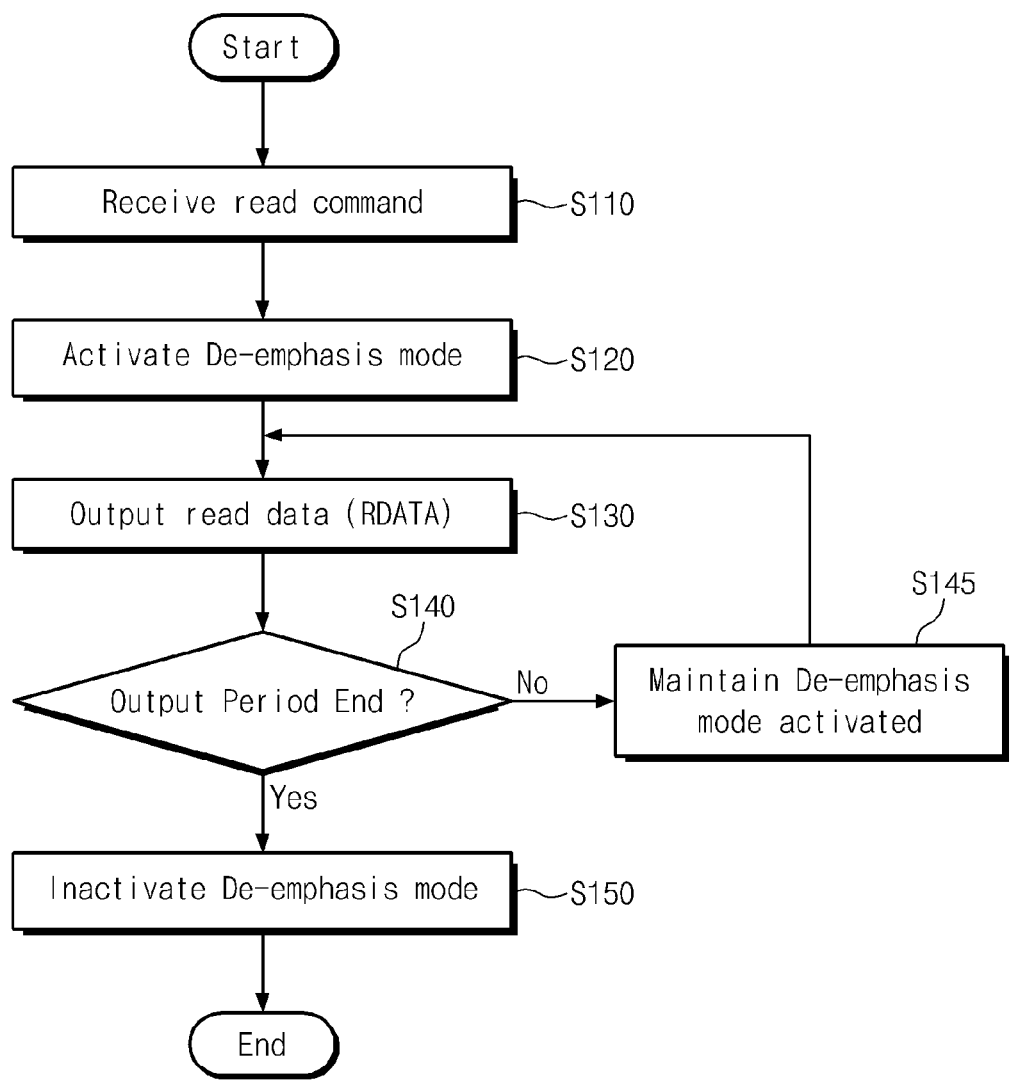
FIG. 8 is a flowchart summarizing one possible de-emphasis control method for the memory device of FIG. 4.

FIG. 8 is a flowchart summarizing one possible de-emphasis control method for the memory device of FIG. 4.

First, a read command RD provided to a memory device 300 is received by the control logic 350 (S110). The control logic 350 activates the de-emphasis mode of the output driver 340 in response to the read command RD (S120). The output driver 340 then outputs the read data RDATA using the de-emphasis mode (S130). Thus, the read data RDATA may be output using four or more signal levels. The control logic 350 determines the end of the output period associated with the read data RDATA based on data length information such as a burst length BL and a CAS latency CL, etc., (S140).

So long as the output period is not ended, the control logic 350 controls the de-emphasis enable signal DMP_EN to maintain the activation of the de-emphasis mode (S145), and the method continues to output the read data RDATA (S130). However, once the output period associated with the read data RDATA is ended (including all front end and back end margins, if any), the control logic 350 inactivates the de-emphasis mode (S150).

Figure 9:
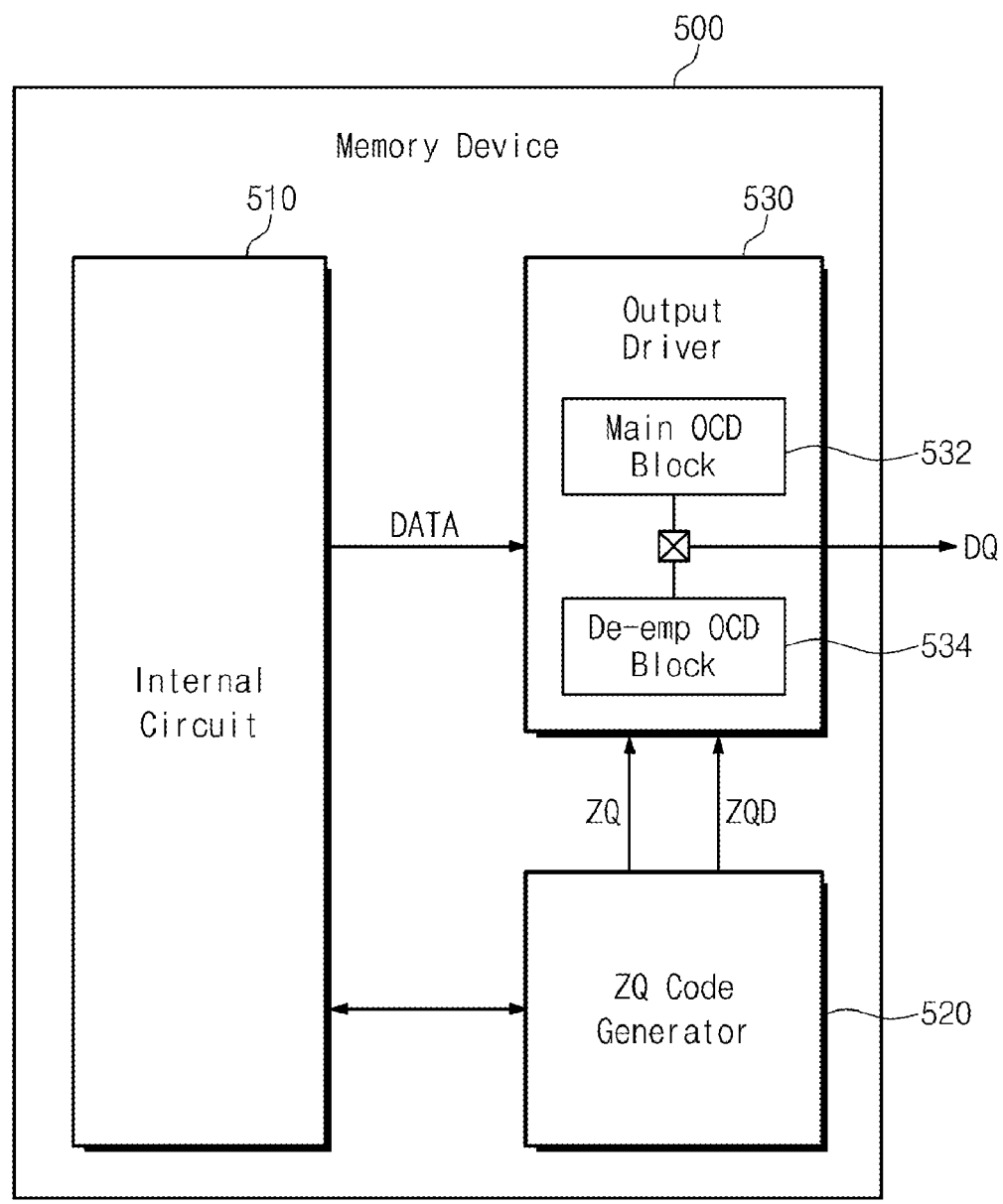
FIG. 9 is a block diagram illustrating a memory device according to another embodiment of the inventive concept.

FIG. 9 is a block diagram illustrating a memory device according to another embodiment of the inventive concept. Referring to FIG. 9, a memory device 500 comprises an internal circuit 510, a ZQ code generator 520, and an output driver 530.

The internal circuit 510 may include a cell array storing data and peripheral logics controlling data read and write operations. The internal circuit 510 may provide data to the output driver 530 in response to a read command.

The ZQ code generator 520 provides impedance control codes ZQ and ZQD to the output driver 530. If the de-emphasis mode is activated, a problem may arise with impedance matching of the output driver 530. It is necessary to control a particular setting of an off-chip driver OCD in order to prevent a problem caused due to variation in the termination impedance through a de-emphasis OCD block 534 of the output driver 530 when the de-emphasis mode is activated. The ZQ code generator 520 may generate the control codes ZQ and ZQD that actively control the resistance of the termination impedance so as to stably maintained the termination impedance during activation/inactivation of the de-emphasis mode and output and non-output periods. Herein, the ZQ code may be provided to a main OCD block 532, and a de-emphasis OCD block 534.

The output driver 530 may include an off-chip driver OCD for internal resistance adjustment. The off-chip driver OCD may be connected to an end of the output driver 530, and may be used to equalize a pull-up signal and a pull-down signal. The off-chip driver OCD of the output driver 530 may be formed of the main OCD block 532 and the de-emphasis OCD block 534.

If a de-emphasis mode is activated, the output driver 530 may be supplied with the control codes ZQ and ZQD for adjusting the impedance from the ZQ code generator 520. The output driver 530 may adjust the pull-up and pull-down impedance to the impedance corresponding to changed control codes ZQ and ZQD.

Figure 10:
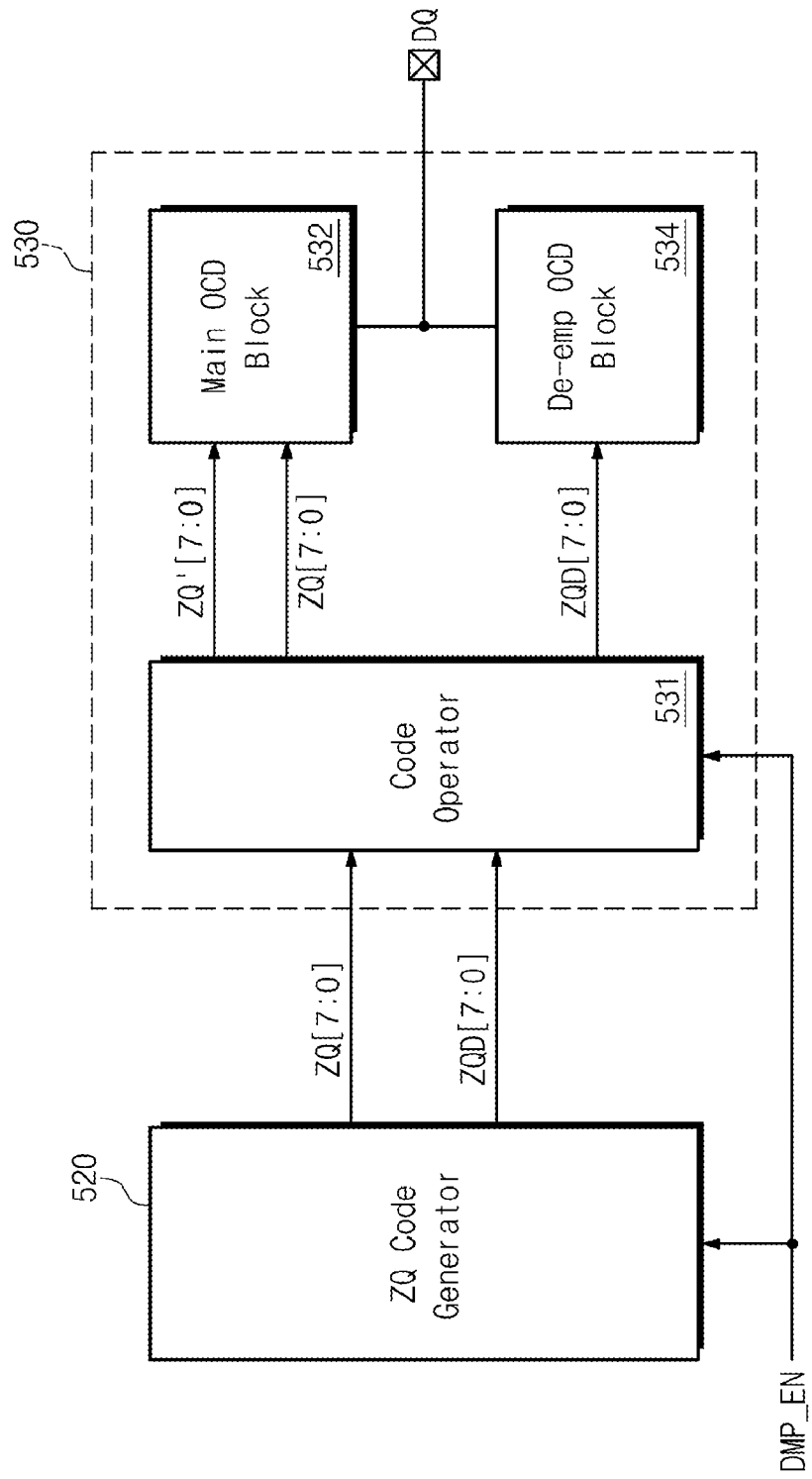
FIG. 10 is a block diagram further illustrating the ZQ code generator and output driver of FIG. 9.

FIG. 10 is a block diagram further illustrating the ZQ code generator and output driver of FIG. 9. Referring to FIG. 10, the output driver 530 comprises a code operator 531, a main OCD block 532, and a de-emphasis OCD block 534.

The ZQ code generator 520 is configured to generate impedance control codes ZQ[7:0] and ZQD[7:0] having different values according to activation of a de-emphasis mode. For example, in the event that a de-emphasis enable signal DMP_EN is inactive, the ZQ code generator 520 may provide the impedance control code ZQ[7:0] to the output driver 530. In a case where the de-emphasis enable signal DMP_EN is active, the ZQ code generator 520 may provide the impedance control codes ZQ[7:0] and ZQD[7:0] to the output driver 530.

The code operator 531 in the output driver 530 may provide the impedance control code ZQ[7:0] to the main OCD block 532 when the de-emphasis enable signal DMP_EN is inactivated. At this time, the main OCD block 532 may provide termination impedance of a reference impedance value.

The code operator 531 may be simultaneously supplied with the impedance control codes ZQ[7:0] and ZQD[7:0] at activation of the de-emphasis enable signal DMP_EN. The code operator 531 may operate the input impedance control codes ZQ[7:0] and ZQD[7:0] to output impedance control codes ZQ'[7:0] and ZQD[7:0] as an operation result. The main OCD block 532 and the de-emphasis OCD block 534 may adjust a termination impedance value in response to the impedance control codes ZQ'[7:0] and ZQD[7:0].

Although varied by activation of the de-emphasis mode, a termination impedance value set for a de-emphasis mode may be maintained despite activation/inactivation of the de-emphasis mode.

Figure 11:
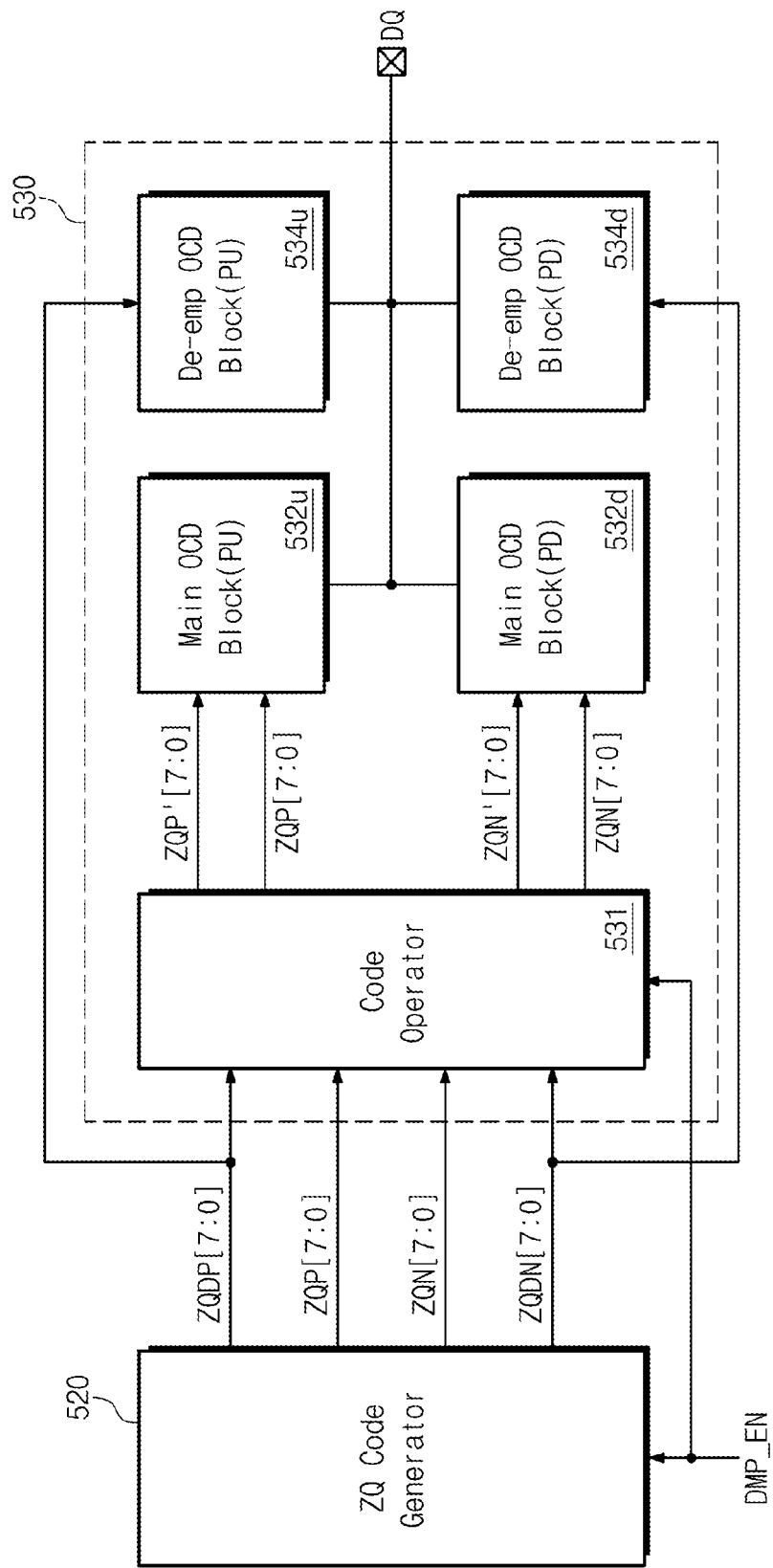
FIG. 11 is a block diagram further illustrating a ZQ code generator and an output driver as operated during a POD signaling scheme.

FIG. 11 is a block diagram further illustrating the ZQ code generator and output driver of FIG. 9 assuming a POD signal scheme. Referring to FIG. 11, the output driver 530 comprises a code operator 531, main OCD blocks 532u and 532d, and de-emphasis OCD blocks 534u and 534d.

A ZQ code generator 520 may be configured to generate impedance control codes ZQP[7:0], ZQN[7:0], ZQDP[7:0], and ZQDN[7:0] having different values according to activation of a de-emphasis mode. For example, in the event that a de-emphasis enable signal DMP_EN is inactivated, the ZQ code generator 520 may provide the impedance control code ZQP[7:0] and ZQD[7:0] to the output driver 530. In a case where the de-emphasis enable signal DMP_EN is activated, the ZQ code generator 520 may provide the impedance control codes ZQP[7:0], ZQN[7:0], ZQDP[7:0], and ZQDN[7:0] to the output driver 530.

The code operator 531 in the output driver 530 may provide the impedance control code ZQP[7:0] and ZQD[7:0] to the main OCD blocks 532u and 532d when the de-emphasis enable signal DMP_EN is inactivated. At this time, the main OCD blocks 532u and 532d may provide termination impedance of a reference impedance value.

The code operator 531 may be simultaneously supplied with the impedance control codes ZQP[7:0], ZQN[7:0], ZQDP[7:0], and ZQDN[7:0] at activation of the de-emphasis enable signal DMP_EN. The code operator 531 may operate the input impedance control codes ZQP[7:0], ZQN[7:0], ZQDP[7:0], and ZQDN[7:0] to output impedance control codes ZQP'[7:0] and ZQN'[7:0] as an operation result. The main OCD blocks 532u and 532d and the de-emphasis OCD blocks 534u and 534d may adjust a termination impedance value. The adjusted termination impedance value may be stably maintained despite the activation/inactivation of the de-emphasis mode.

Figure 12:
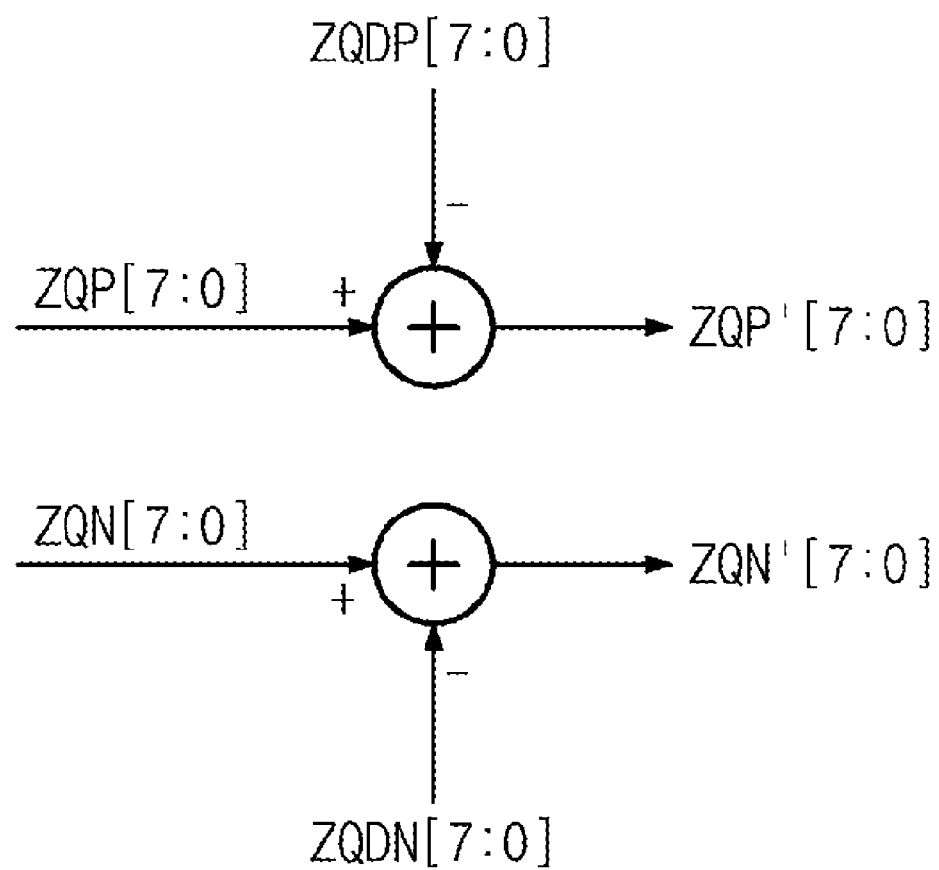
FIG. 12 is a diagram further illustrating the code operator of FIG. 11.

FIG. 12 is a diagram further describing the operation of the code operator of FIG. 11. FIG. 12 illustrates one possible method for generating impedance control codes ZQP'[7:0] and ZQN'[7:0] that are provided to main OCD blocks 532u and 532d during activation of the de-emphasis mode.

If the de-emphasis mode is activated, a ZQ code generator 520 may provide impedance control codes ZQDP[7:0] and ZQDN[7:0] together impedance control codes ZQP[7:0] and ZQN[7:0]. The impedance control codes ZQDP[7:0] and ZQDN[7:0] may be codes for setting impedance of de-emphasis OCD blocks 534u and 534d. A code operator 531 may subtract the impedance control codes ZQDP[7:0] and ZQDN[7:0] from the impedance control codes ZQP[7:0] and ZQN[7:0] to generate impedance control codes ZQP'[7:0] and ZQN'[7:0].

The impedance control codes ZQP'[7:0] and ZQN'[7:0] may be provided to main OCD blocks 532u and 532d. The main OCD blocks 532u and 532d may adjust termination impedance in response to the impedance control codes ZQP'[7:0] and ZQN'[7:0]. The impedance control codes ZQDP[7:0] and ZQDN[7:0] may be provided to the de-emphasis OCD blocks 534u and 534d. The termination impedance may maintain reference impedance by the main OCD blocks 532u and 532d set by the impedance control codes ZQP'[7:0] and ZQN'[7:0] and the de-emphasis OCD blocks 534u and 534d set by the impedance control codes ZQDP[7:0] and ZQDN[7:0].

Figure 13:
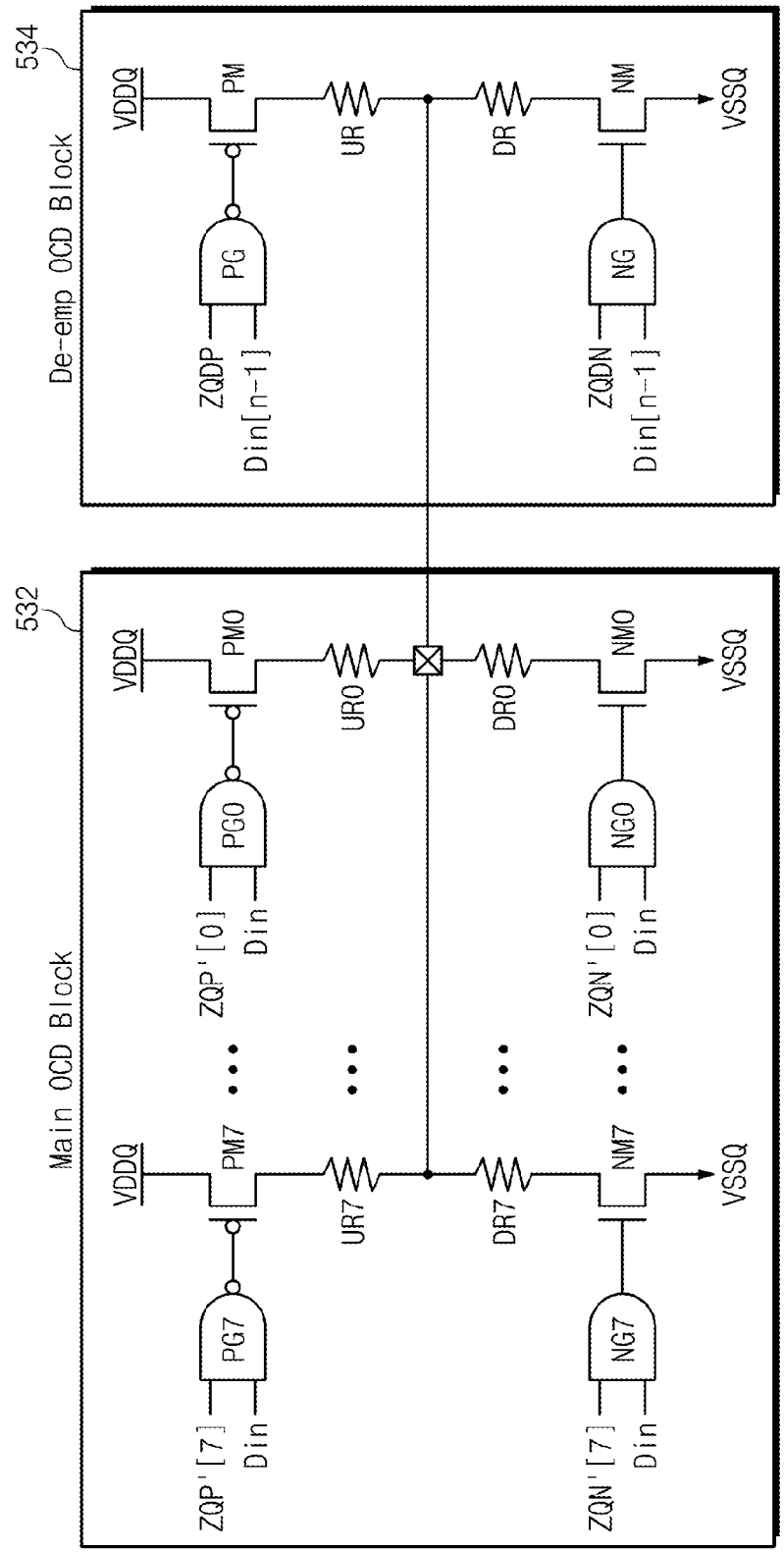
FIG. 13 is a circuit diagram further illustrating a main OCD block and de-emphasis OCD block as operated during a POD signaling scheme.

FIG. 13 is a circuit diagram further illustrating the main OCD block 532 and de-emphasis OCD block that are assumed to be operated according to a POD signaling scheme. It is assumed that when a de-emphasis mode is not used, a pull-up and pull-down resistance has impedance of 50Ω and each of impedance control codes ZQP[7:0] and ZQN[7:0] has a value of "10000000".

In a case where the de-emphasis mode is not used, the impedance control codes ZQP[7:0] and ZQN[7:0] each having a value of "10000000" may be provided to a main OCD block 532. Pull-up and pull-down impedance may be set to 50Ω via resistors UR7 and DR7.

In the event that the de-emphasis mode is used, if the impedance control codes ZQP[7:0] and ZQN[7:0] each having a value of "00001000" are provided, a code operator 531 may provide impedance control codes ZQP'[7:0] and ZQN'[7:0] each having a value of "01110000". Pull-up and pull-down impedance of the main OCD block 532 may be set by the impedance control codes ZQP'[7:0] and ZQN'[7:0] each having a value of "01110000".

Impedance control codes ZQDP[7:0] and ZQDN[7:0] each having a value of "00001000" may be provided to the de-emphasis OCD block 534. A value "10000000" obtained by summing control code values "01110000" and "000010000" may correspond to 50Ω. Accordingly, termination impedance of an OCD block may be stably maintained at 50Ω regardless of activation/deactivation of the de-emphasis mode.

Figure 14:
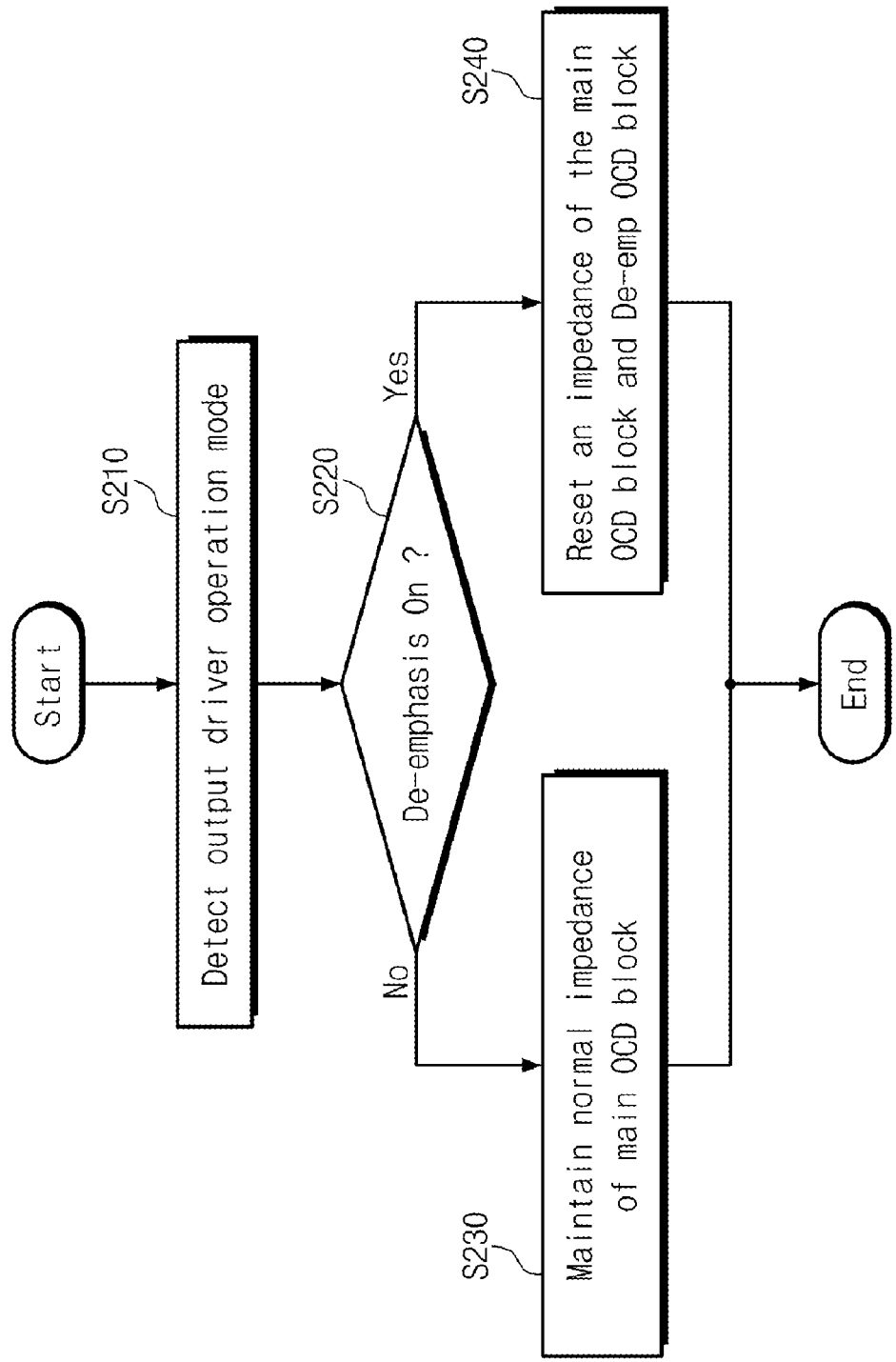
FIG. 14 is a flowchart summarizing one possible termination impedance control method for an output driver according to an embodiment of the inventive concept.

FIG. 14 is a flowchart summarizing one possible approach to termination impedance control for an output driver according to an embodiment of the inventive concept. Referring to FIG. 14, an output driver according to an embodiment of the inventive concept may prevent variation of termination impedance by impedance adjustment upon activation of the de-emphasis mode.

First, the ZQ code generator 520 and output driver 530 detect whether a de-emphasis mode is activated or inactivated (S210). Then, if the de-emphasis mode is inactivated (S220=No), the ZQ code generator 520 maintains the impedance control code ZQ for setting impedance of a main OCD block 532 of the output driver 530 at a normal mode (S230). However, if the de-emphasis mode is activated, the ZQ code generator 520 generates impedance control codes ZQ and ZQD for setting the main OCD block 532 and a de-emphasis OCD block 534 of the output driver 530 according to the de-emphasis mode (S240). The impedance control codes ZQ and ZQD may be output as impedance control codes ZQ' and ZQD by a code operator 531 so as to be set to the same value as impedance at a normal mode. If the main OCD block 532 and the de-emphasis OCD block 534 are set by the impedance control codes ZQ' and ZQD, termination impedance of the output driver 530 may be set to a reference impedance value even at the de-emphasis mode.

Figure 15:
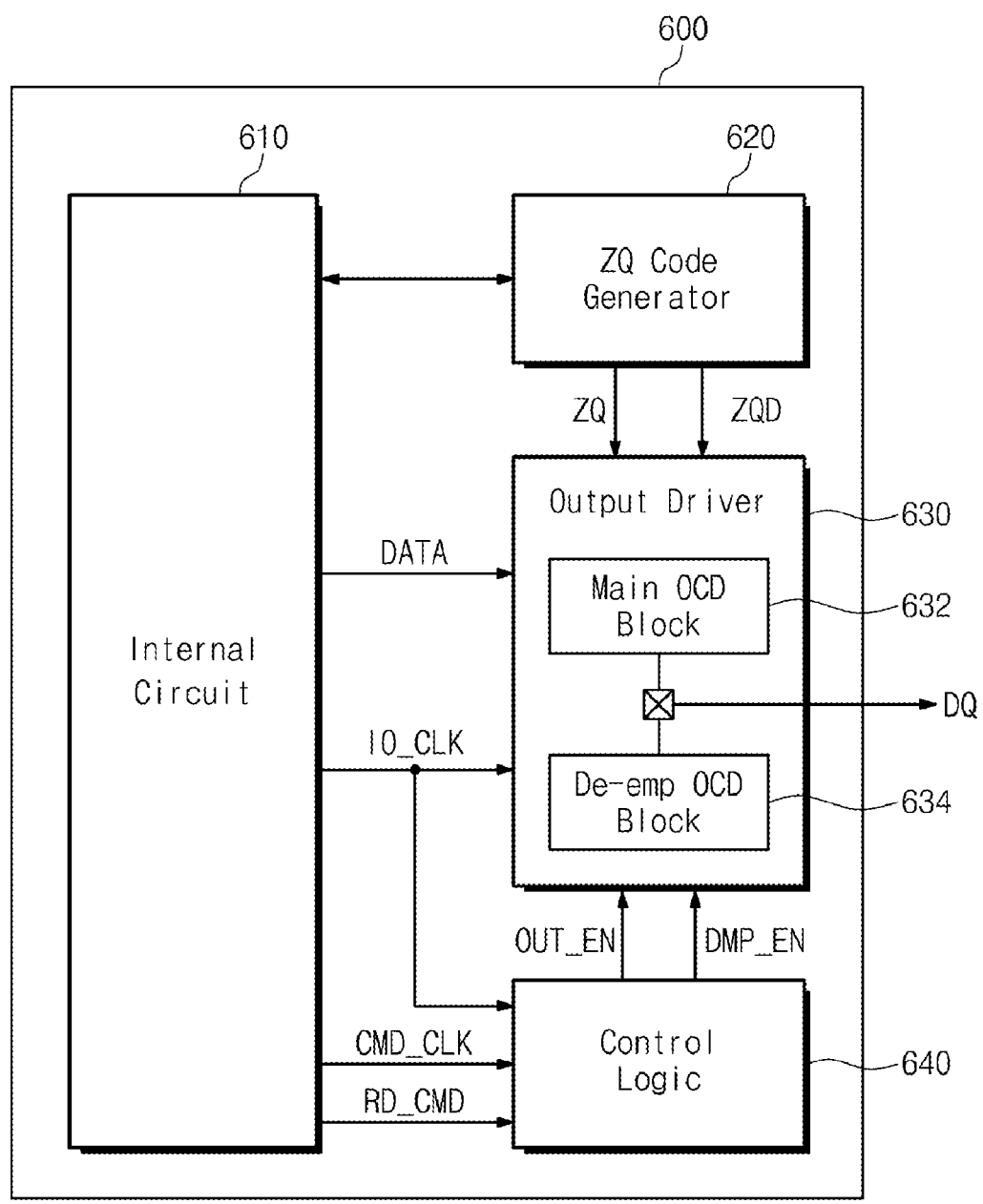
FIG. 15 is a block diagram illustrating a memory device according to another embodiment of the inventive concept.

FIG. 15 is a block diagram illustrating a memory device according to another embodiment of the inventive concept. Referring to FIG. 15, a memory device 600 comprises an internal circuit 610, a ZQ code generator 620, an output driver 630, and control logic 640.

The internal circuit 610 provides data to the output driver 630 or clock signals IO_CLK and CMD_CLK. The ZQ code generator 620 provides impedance control codes ZQ and ZQD to the output driver 630. If a de-emphasis mode is activated, it is necessary to control a setting value of an off-chip driver OCD in order to prevent a problem caused due to a variation of termination impedance through a de-emphasis block 634 of the output driver 630. The ZQ code generator 520 may generate the control codes ZQ and ZQD for controlling a resistance of the termination impedance so as to be maintained the termination impedance during activation/inactivation of the de-emphasis mode.

The control logic 640 provides the output driver 630 with an output enable signal OUT_EN and a de-emphasis enable signal DMP_EN. The control logic 640 generates the output enable signal OUT_EN and the de-emphasis enable signal DMP_EN in response to a read command RD_CMD provided from an external device. The control logic 640 may activate the de-emphasis enable signal DMP_EN at an actual data output point of time based upon the read command RD_CMD and a burst length BL. This means that the de-emphasis enable signal DMP_EN is inactivated when data is not output. It is well understood that the control logic 640 is supplied with various information such as the read command RD_CMD, the burst length BL, an address, etc. to determine a point of time when data is actually output.

The output driver 630 may include an off-chip driver OCD for internal resistance adjustment. The off-chip driver OCD may be connected to an end of the output driver 630, and may be used to equalize a pull-up signal and a pull-down signal by adjusting a cross voltage. The off-chip driver OCD of the output driver 630 may be formed of a main OCD block 632 and a de-emphasis OCD block 634.

The output driver 630 may output data in response to the output enable signal OUT_EN. The data may be output in synchronization with the input/output clock IO_CLK. In particular, the output driver 630 may output data in a de-emphasis manner in response to the de-emphasis enable signal DMP_EN.

The memory device 600 of FIG. 15 may operate according to the de-emphasis control method described in relation to FIG. 4 and/or the impedance control method described in relation to FIG. 9.

Figure 16:
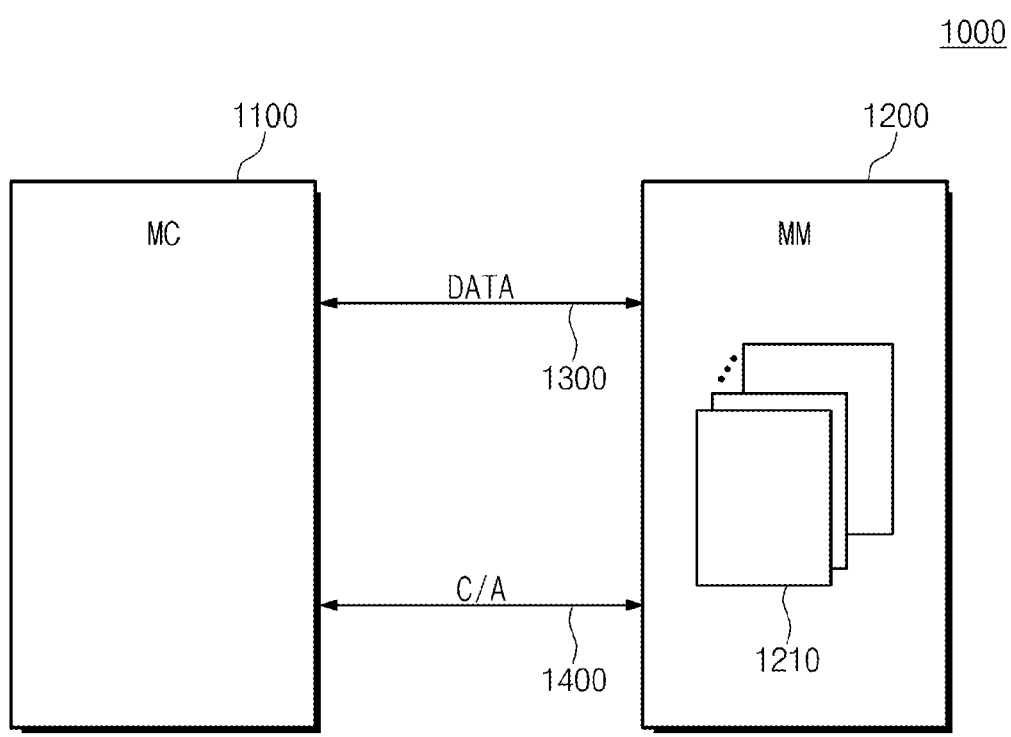
FIG. 16 is a general block diagram of a memory system including a memory device according to an embodiment of the inventive concept.

FIG. 16 is a block diagram illustrating a memory system including a memory device according to an embodiment of the inventive concept. Referring to FIG. 16, a memory system 1000 generally comprises a memory controller (MC) 1200 and a memory module 1200 connected via a data bus 1300 and an address and control bus 1400.

The data bus 1300 may be formed of a transfer line per data bit. The data bus 1300 may be formed of 64 transfer lines to transfer a 64-bit width of data, for example. The memory module 1200 may include a plurality of memory chips 1210. If the memory module 1200 is formed of eight memory chips each having eight data output terminals, it may include 64 data output terminals for external interconnection.

Each of the memory chips 1210 of the memory module 1200 may include an output driver which is configured to transfer data in a de-emphasis manner. The output driver may be configured to activate the de-emphasis mode only during output periods. Further, the output driver may be configured to prevent a variation of termination impedance according to activation/deactivation (e.g., upon entry into the de-emphasis mode by adjusting the termination impedance when the de-emphasis mode is activated). Accordingly, if the memory module 1200 is implemented using a memory device according to an exemplary embodiment of the inventive concept, a high speed, a high reliability, and a low-power characteristic may be expected.

Figure 17:
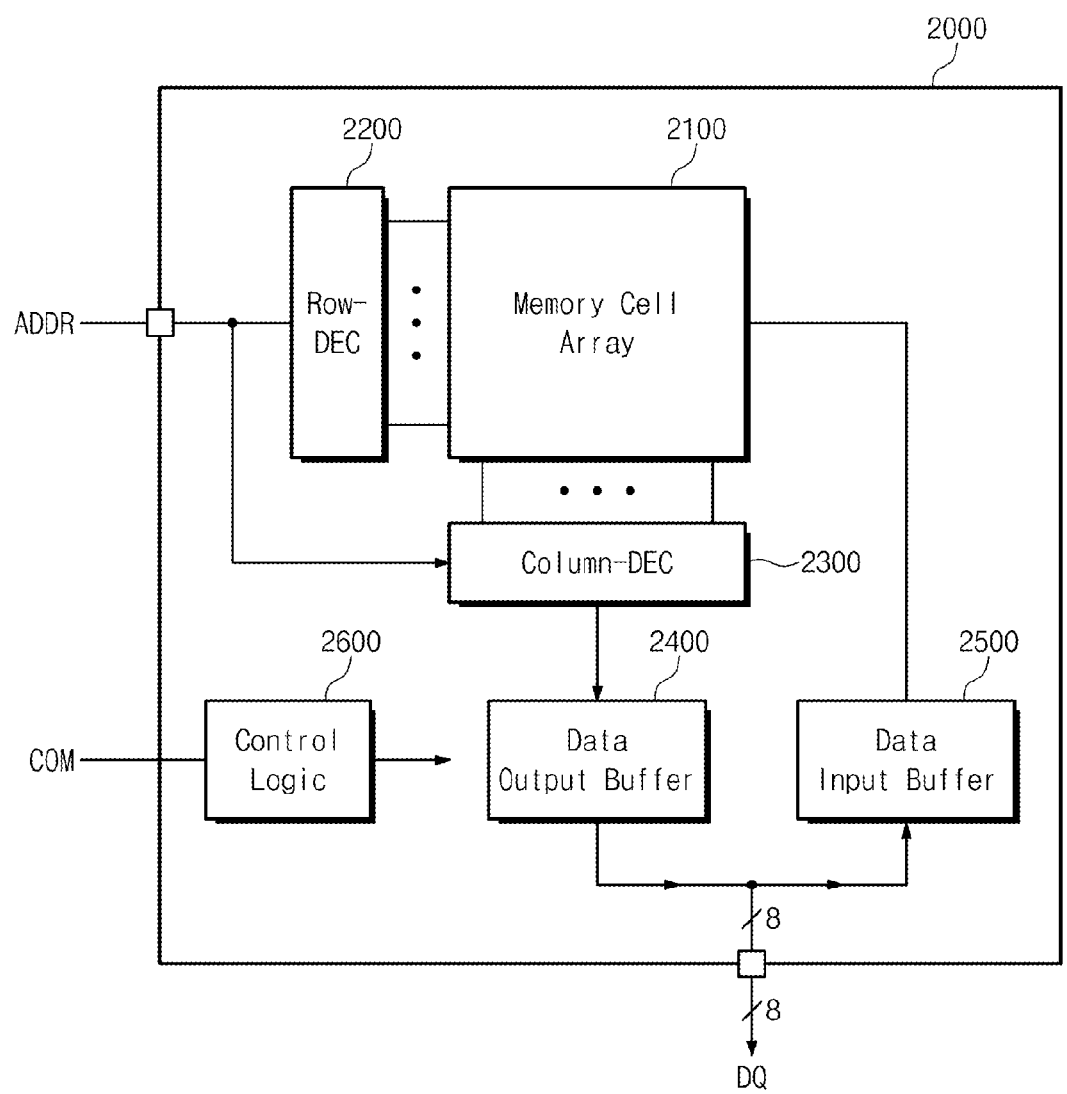
FIG. 17 is a block diagram further illustrating the memory chip included in the memory module of FIG. 16.

FIG. 17 is a block diagram further illustrating a memory chip that may be included in the memory module of FIG. 16. Referring to FIG. 17, a memory chip 2000 comprises a memory cell array 2100, a row address decoder 2200, a column address decoder 2300, a data output buffer 2400, a data input buffer 2500, and control logic 2600.

The control logic 2600 may be configured to generate internal control signals in response to an external command signal COM. The row address decoder 2200 may be configured to select a specific row of the memory cell array 2100 in response to an external address signal ADDR. The column address decoder 2300 may be configured to select a specific column of the memory cell array 2100 in response to the external address signal ADDR. The data output buffer 2400 may provide eight data input/output terminals DQ with n-bit data (e.g., 8-bit data) accessed from memory cells appointed by the row and column selected by the external address signal. The data output buffer 2400 may include output buffers each connected with data output terminals DQ, and the number of the output buffers may correspond to the number of the data output terminals. The data input buffer 2500 may write data input via the data input/output terminals DQ in the memory cells appointed by the row and column selected according to the external address signal ADDR.

The data output buffer 2400 may include an output driver according to an exemplary embodiment of the inventive concept. The data output buffer 2400 may be configured to activate the de-emphasis mode only during output periods. The data output buffer 2400 may be configured to prevent a variation of termination impedance according to an entry into the de-emphasis mode by adjusting the termination impedance when the de-emphasis mode is activated.

Figure 18:
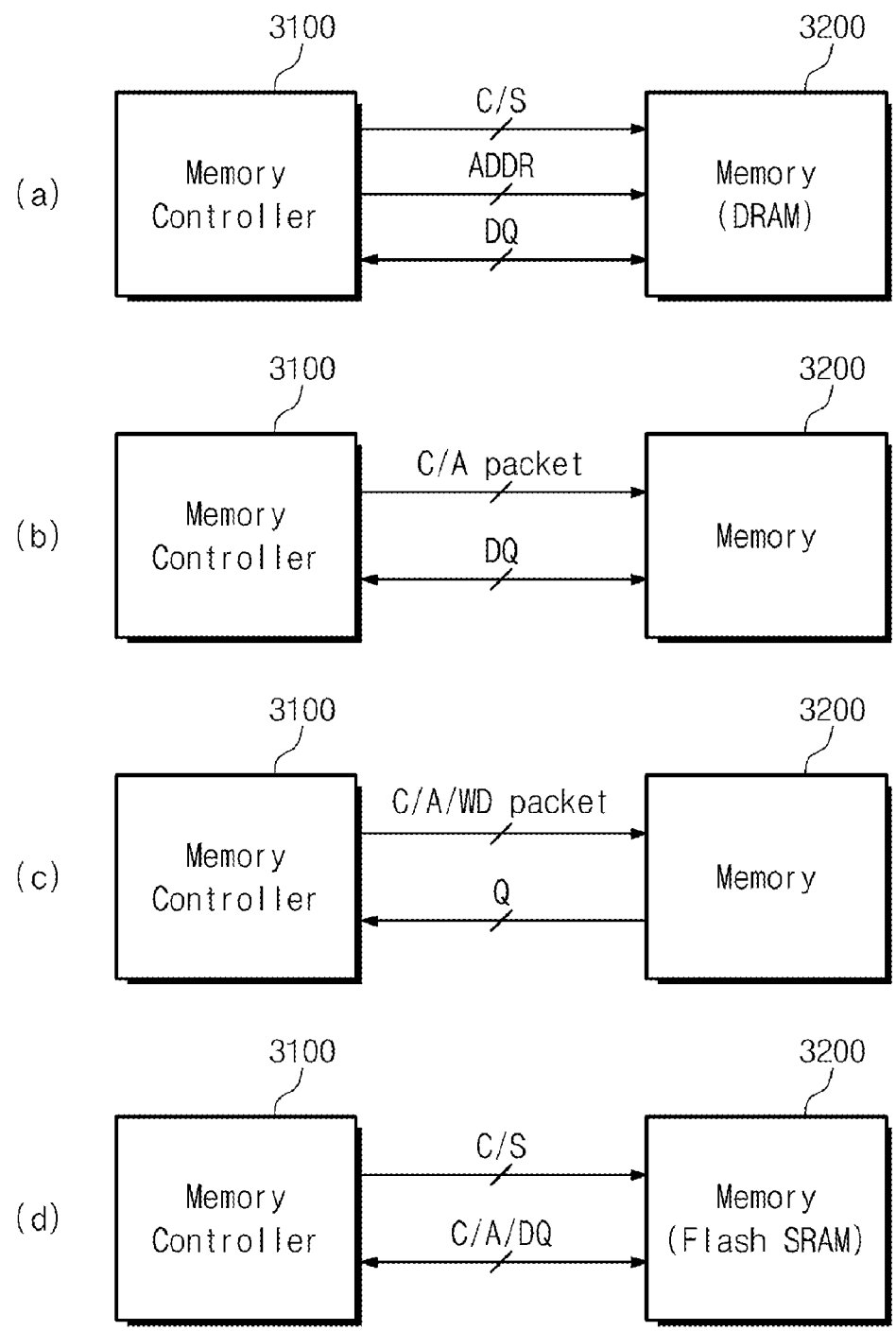
FIG. 18, inclusive of FIGS. 18a-18d, illustrates various memory bus connection architectures between a memory controller and a memory according to an embodiment of the inventive concept.

FIG. 18, inclusive of FIGS. 18a through 18d, illustrates various bus architectures that may be used to connect the memory controller with a memory according to embodiments of the inventive concept.

Referring to FIG. 18a, there is exemplarily illustrated a bus protocol between a memory controller 3100 and a memory 3200 (e.g., DRAM). Control signals (e.g., /CS, CKE, /RAS, /CAS, /WE, etc.) and an address signal ADDR may be sent to the memory 3200 from the memory controller 3100. Data DQ may be transferred bilaterally.

Referring to FIG. 18b, packetized control signals and address signals C/A Packet may be sent to the memory 3200 from the memory controller 3100. Data DQ may be transferred bilaterally.

Referring to FIG. 18c, packetized control signals, address signals, and write signals C/A/WD Packet may be sent to the memory 3200 from the memory controller 3100. Data DQ may be transferred in one direction from the memory 3200 to the memory controller 3100.

Referring to FIG. 18d, control signals C/S may be provided to the memory 3200 (e.g., a flash SRAM) from the memory controller 3100. A command, an address, and data C/A/DQ may be transferred bilaterally.

In FIGS. 18a through 18d, the memory device 3200 may include an output driver which is configured to transfer data in a de-emphasis manner. The output driver may be configured to activate the de-emphasis mode only during output periods. Further, the output driver may be configured to prevent a variation of termination impedance according to an entry into the de-emphasis mode by adjusting the termination impedance when the de-emphasis mode is activated. Accordingly, if a memory system is implemented using a memory device according to an exemplary embodiment of the inventive concept, a high speed, a high reliability, and a low-power characteristic may be expected.

Figure 19:
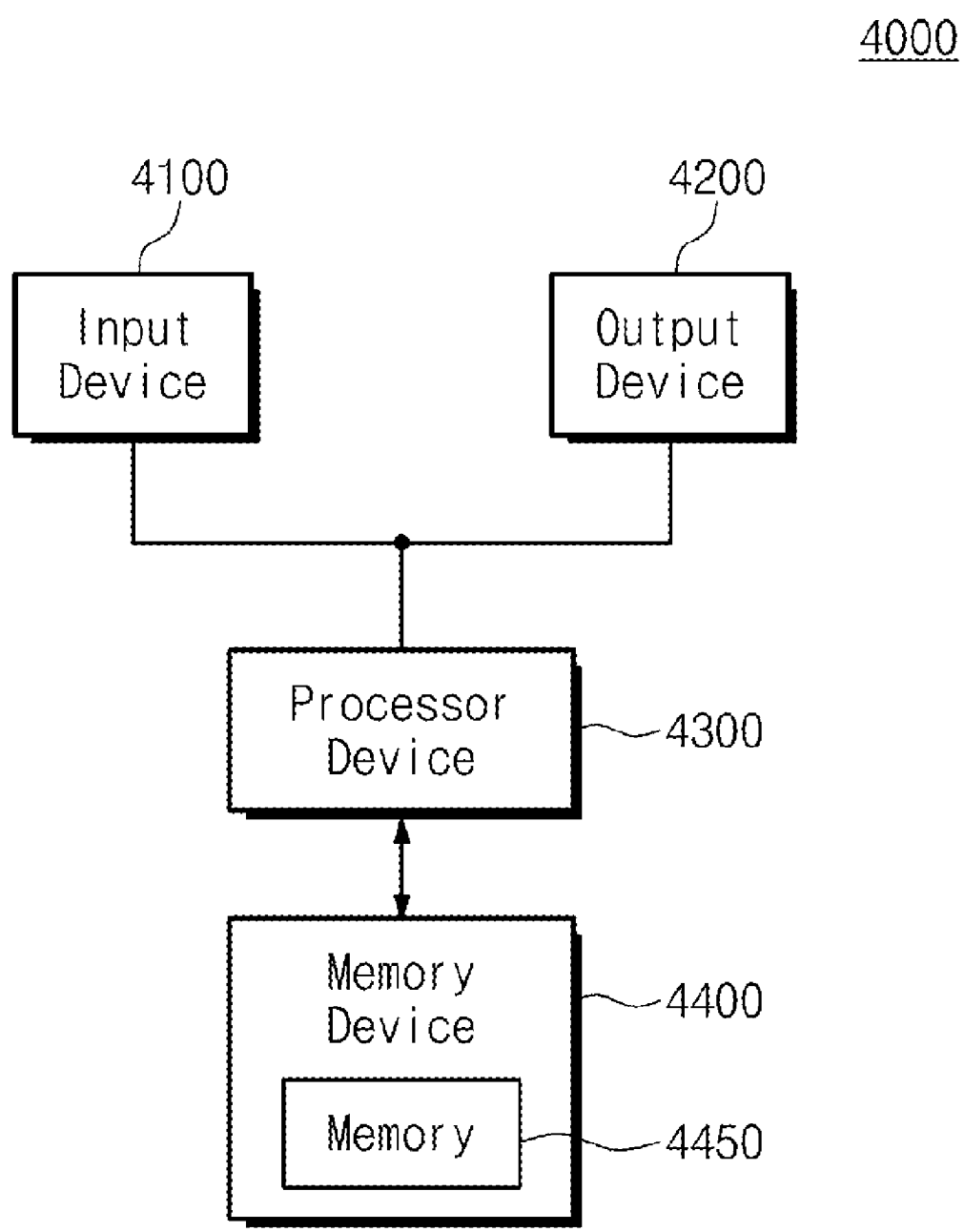
FIG. 19 is a block diagram illustrating an electronic system including a memory device according to an embodiment of the inventive concept.

FIG. 19 is a block diagram illustrating an electronic system including a memory device according to an embodiment of the inventive concept. Referring to FIG. 19, an electronic system 4000 comprises an input device 4100, an output device 4200, a processor device 4300, and a memory device 4400.

The memory device 4400 may include an output driver which is configured to transfer data in a de-emphasis manner. The output driver may be configured to activate the de-emphasis mode only during output periods. Further, the output driver may be configured to prevent a variation of termination impedance according to an entry into the de-emphasis mode by adjusting the termination impedance when the de-emphasis mode is activated. Accordingly, if an electronic system is implemented using a memory device according to an exemplary embodiment of the inventive concept, a high speed, a high reliability, and a low-power characteristic may be expected. Herein, the output device 4200 can be implemented to include an output driver according to an embodiment of the inventive concept.

As will be appreciated by those skilled in the art, the processor device 4300 may control the elements 4100, 4200, and 4400 via corresponding interfaces.

Figure 20:
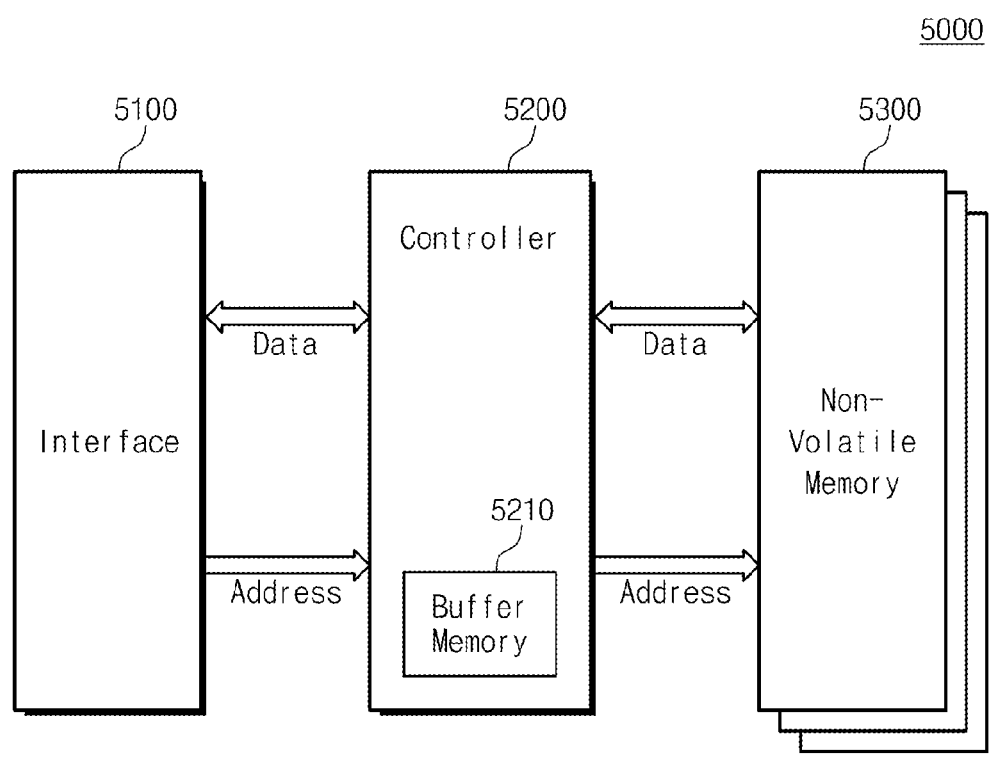
FIG. 20 is a block diagram illustrating a memory card using a storage media according to an embodiment of the inventive concept.

FIG. 20 is a block diagram illustrating a memory card using a storage media according to an embodiment of the inventive concept. Referring to FIG. 20, a memory card 5000 comprises an interface unit 5100, a controller 5200, and a nonvolatile memory device 5300.

The interface unit 2100 may provide an interface between the memory card 5000 and a host. The interface unit 2100 may include a data exchange protocol corresponding to the host for interfacing with the host. The interface unit 2100 may be configured to communicate with the host via one of interface protocols such as Universal Serial Bus (USB), Multi-Media Card (MMC), Peripheral Component Interconnect-Express (PCI-E), Serial-attached SCSI (SAS), Serial Advanced Technology Attachment (SATA), Parallel Advanced Technology Attachment (PATA), Small Computer System Interface (SCSI), Enhanced Small Disk Interface (ESDI), Integrated Drive Electronics (IDE), and the like.

The controller 5200 may receive data and an address provided from an external device via the interface unit 5100. The controller 5200 may access the nonvolatile memory device 5300 in response to the input data and address. The controller 5200 may transfer data read out from the nonvolatile memory device 5300 to a host via the interface unit 5100. The controller 5200 may include a buffer memory 5210.

The buffer memory 5210 may temporarily store write data provided from the host or data read out from the nonvolatile memory device 5300. If data existing at the nonvolatile memory device 5300 is cached at a read request of the host, the buffer memory 5210 may support a cache function of providing cached data directly to the host. Typically, a data transfer speed according to a bus format (e.g., SATA or SAS) of the host may be extraordinarily higher than a transfer speed of a memory channel of the memory card 5000. In a case where an interface speed of the host is extraordinarily high, a decrease in the performance due to a speed difference may be minimized by providing the buffer memory 5210.

The nonvolatile memory device 5300 may be provided as a storage media of the memory card 5000. For example, the nonvolatile memory device 5300 may be formed of a resistive memory device. Alternatively, the nonvolatile memory device 5300 may be formed of a NAND-type flash memory with a large storage capacity. The nonvolatile memory device 5300 may be formed of a plurality of memory devices. In this case, each memory device may be connected with the controller 5200 by the channel. The nonvolatile memory device 5300 being a storage media may be formed of PRAM, MRAM, ReRAM, FRAM, or a NOR flash memory, and may be applied to a memory system including different types of memory devices.

An output driver according to an embodiment of the inventive concept may be incorporated within the buffer memory 5210 and/or the nonvolatile memory device 5300 using a de-emphasis mode.

Figure 21:
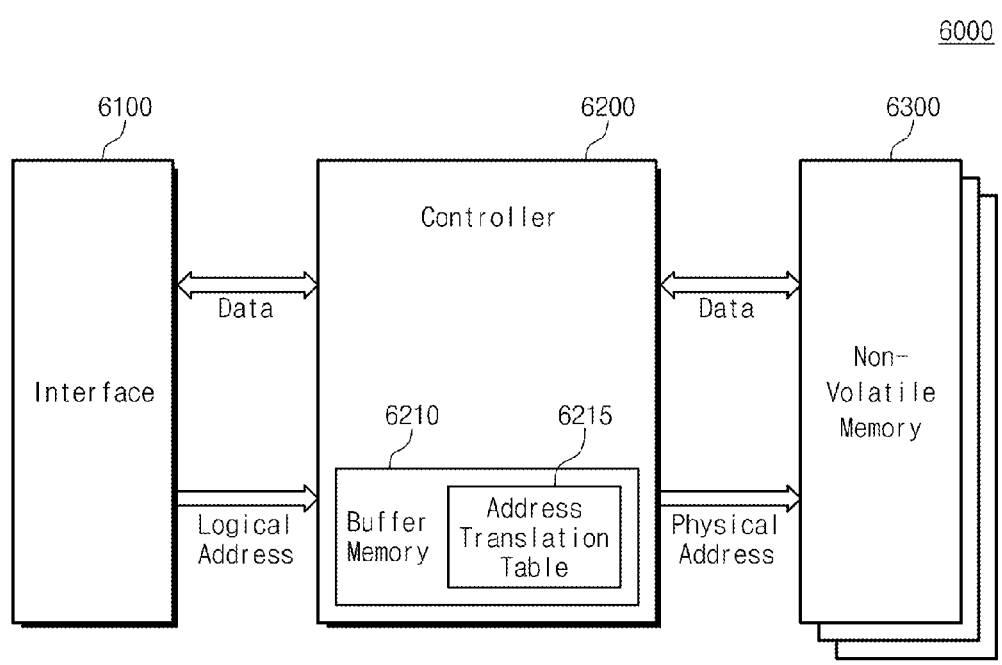
FIG. 21 is a block diagram illustrating a memory card according to another embodiment of the inventive concept.

FIG. 21 is a block diagram illustrating a memory card according to another embodiment of the inventive concept. Referring to FIG. 21, a memory card 6000 comprises an interface unit 6100, a controller 6200, and a nonvolatile memory device 6300. The elements 6100 and 6300 in FIG. 21 may be substantially identical to those in FIG. 20, and description thereof is thus omitted.

The controller 6200 may include a buffer memory 6210 storing an address translation table 6215. The controller 6200 may translate a logical address provided from the interface unit 6100 into a physical address based upon the address translation table 6215. The controller 6200 may access the nonvolatile memory device 6300 based upon the converted physical address.

An output driver according to an embodiment of the inventive concept may be incorporated within the buffer memory 6210 and/or the nonvolatile memory device 6300 using a de-emphasis mode.

Memory cards 5000 and 6000 illustrated in FIGS. 20 and 21 may be mounted at information processing devices such as a digital camera, a portable media player (PMP), a mobile phone, a notebook computer, and the like. The memory cards 5000 and 6000 may be an MMC card, an SD card, a micro SD card, a memory stick, an ID card, a PCMCIA (Personal Computer Memory Card International Association) card, a chip card, a USB card, a smart card, a CF card, or the like.

Figure 22:
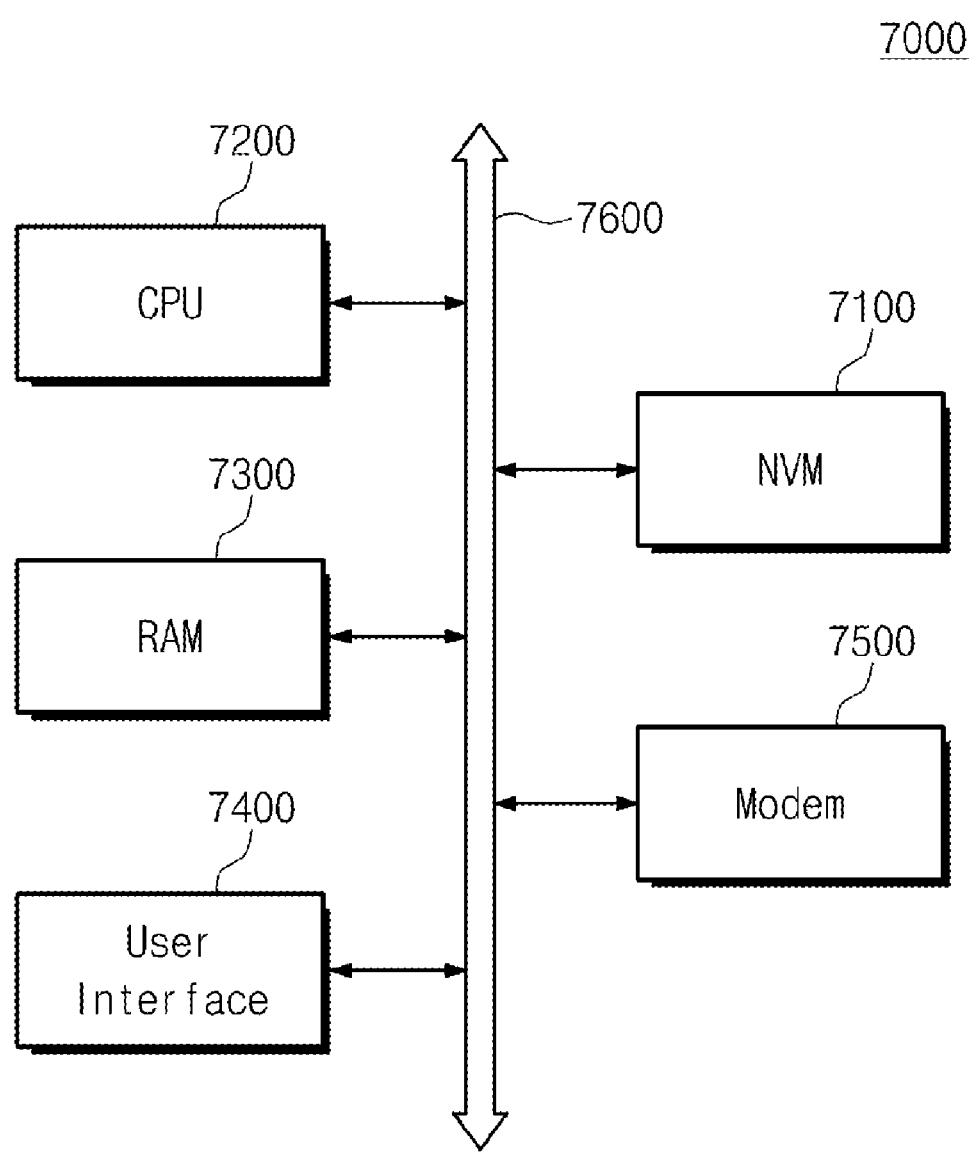
FIG. 22 is a block diagram illustrating a computing system including a RAM according to an embodiment of the inventive concept.

FIG. 22 is a block diagram illustrating a computational system including a RAM according to an embodiment of the inventive concept. Referring to FIG. 22, a computational system 7000 comprises a CPU 7200, a RAM 7300, a user interface 7400, a modem 7500 such as a baseband chipset, and a memory system 7100 which are electrically connected with a system bus 7600.

If the computational system 7000 is a mobile device, it may further include a battery (not shown) for supplying an operating voltage of the computing system 4000. Although not shown in FIG. 22, the computational system 7000 may further include an application chipset, a camera image processor (CIP), a mobile DRAM, and the like. The memory system 7100 may be formed of a solid state drive/disk (SSD) using a nonvolatile memory to store data.

A memory device and/or a controller according to an embodiment of the inventive concept may be packed by various types of packages such as PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

According to embodiments of the inventive concept, it is possible to dramatically reduce leakage current by controlling the ON/OFF state of a de-emphasis block of an output driver. Further, impedance matching may be accomplished by adjusting ZQ codes.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor memory device comprising:
a memory cell array;
an output driver having a pseudo-open drain (POD) structure and configured to output read data retrieved from the memory cell array in a de-emphasis mode; and
a control logic configured to control the output driver and activate the de-emphasis mode in response to a received read command,
wherein the control logic activates the de-emphasis mode only during an output period in which the read data is output by the output driver in the de-emphasis mode.

2. The semiconductor memory device of claim 1, wherein the output period is defined by the control logic by subtracting at least one clock cycle from a CAS latency.

3. The semiconductor memory device of claim 1, wherein the output period is defined by the control logic based on data length information.

4. The semiconductor memory device of claim 3, wherein the data length information includes at least one of CAS latency and burst length.

5. The semiconductor memory device of claim 1, wherein the output driver comprises at least one resistive element connected between an output node and a power node.

6. The semiconductor memory device of claim 1, wherein the control logic is further configured to maintain activation of the de-emphasis mode when successive read commands are separated in time by less a defined margin.

7. The semiconductor memory device of claim 1, wherein the output driver comprises an off-chip driver (OCD) circuit configured to stably maintain a termination impedance regardless of activation/inactivation of the de-emphasis mode.

8. The semiconductor memory device of claim 7, wherein the OCD circuit comprises:
a main OCD block configured to provide a reference impedance for an output terminal when the de-emphasis mode is inactivated; and
a de-emphasis OCD block configured to adjust a termination impedance of the output terminal to the reference impedance upon activation of the de-emphasis mode.

9. The semiconductor memory device of claim 8, further comprising:
a control code generator configured to provide a first control code to the main OCD block and a second control code to the de-emphasis OCD block, such that the termination impedance of the output terminal is maintained at the reference impedance.

10. The semiconductor memory device of claim 9, wherein during the de-emphasis mode, the control code generator provides the second code to the de-emphasis OCD block and a third control code to the main OCD block, the third control code being generated by subtracting the second control code from the first control code.

11. A control method for an output driver in a semiconductor memory device, the output driver being operated according to a pseudo-open drain (POD) signaling scheme, the method comprising:
upon receiving a read command, activating a de-emphasis mode for the output driver;
retrieving read data from a cell array and outputting the read data in the de-emphasis mode; and
inactivating the de-emphasis mode when the read data is output is complete, such that the de-emphasis mode is only activated during an output period during which the read data is output by the output driver.

12. The output driver control method of claim 11, further comprising:
adjusting a termination impedance of the output driver during the output period.

13. The output driver control method of claim 12, wherein the termination impedance of the output driver is adjusted to maintain a reference impedance value upon activation/inactivation of the de-emphasis mode.

14. The output driver control method of claim 12, further comprising:
generating an impedance control code for adjusting a termination impedance of an off-chip driver (OCD) circuit within the output driver upon activation of the de-emphasis mode.

15. The output driver control method of claim 14, wherein the generating the impedance control code comprises:
generating a first control code for controlling a main OCD block of the OCD circuit so as to provide the reference impedance value upon inactivation of the de-emphasis mode;
generating a second control code for setting a termination impedance of a de-emphasis OCD block of the OCD circuit upon activation of the de-emphasis mode; and
generating a third control code for setting a termination impedance of the main OCD block upon activation of the de-emphasis mode.

16. A control method for an output driver in a semiconductor memory in a system including the semiconductor memory and a memory controller, wherein the output driver is operated according to a pseudo-open drain (POD) signaling scheme and the method comprises:
communicating a read command, an output enable signal, and a de-emphasis enable signal from the memory controller to the semiconductor memory;
retrieving read data identified by the read command from a cell array in the semiconductor memory;
in response to the output enable signal and the de-emphasis enable signal, either outputting the read data via a normal driver in the output driver or outputting the read data via a de-emphasis driver in the output driver, such that the de-emphasis driver is only activated during an output period in which the read data is output by via the de-emphasis driver.

17. The method of claim 16, wherein the output period includes at least one of a front end margin and a back end margin extending beyond a period of time in which the read data is output by the de-emphasis driver.

18. The method of claim 16, wherein the output period is defined on the basis of at least one of CAS latency and burst length.

19. The method of claim 18, wherein at least the read command is communicated from the memory controller to the semiconductor memory synchronously with an external clock.

20. The method of claim 19, wherein the read data is communicated from the cell array to the output driver synchronously with an internal clock derived from the external clock.

* * * * *